(12) United States Patent
Chen

(10) Patent No.: US 9,196,628 B1
(45) Date of Patent: Nov. 24, 2015

(54) 3D STACKED IC DEVICE WITH STEPPED SUBSTACK INTERLAYER CONNECTORS

(71) Applicant: MACRONIX INTERNATIONAL CO., LTD., Hsinchu (TW)

(72) Inventor: Shih-Hung Chen, Hsinchu (TW)

(73) Assignee: Macronix International Co., Ltd., Hsinchu (TW)

( * ) Notice: Subject to any disclaimer, the term of this patent is extended or adjusted under 35 U.S.C. 154(b) by 0 days.

(21) Appl. No.: 14/273,206

(22) Filed: May 8, 2014

(51) Int. Cl.
| | |
|---|---|
| H01L 23/48 | (2006.01) |
| H01L 27/115 | (2006.01) |
| H01L 23/528 | (2006.01) |
| H01L 23/522 | (2006.01) |
| H01L 21/768 | (2006.01) |

(52) U.S. Cl.
CPC .... H01L 27/11578 (2013.01); H01L 21/76877 (2013.01); H01L 23/528 (2013.01); H01L 23/5226 (2013.01)

(58) Field of Classification Search
CPC .................. H01L 27/11578; H01L 27/11573; H01L 21/76877; H01L 23/5226; H01L 23/528
USPC ......................... 257/758, 324, 211
See application file for complete search history.

(56) References Cited

U.S. PATENT DOCUMENTS

| | | | |
|---|---|---|---|
| 5,218,471 A | 6/1993 | Swanson et al. |
| 6,034,882 A | 3/2000 | Johnson et al. |
| 6,906,361 B2 | 6/2005 | Zhang |
| 6,906,940 B1 | 6/2005 | Lue |
| 7,081,377 B2 | 7/2006 | Cleeves |
| 7,129,538 B2 | 10/2006 | Lee et al. |
| 7,177,169 B2 | 2/2007 | Scheuerlein |
| 7,274,594 B2 | 9/2007 | Pascucci et al. |
| 7,315,474 B2 | 1/2008 | Lue |
| 7,382,647 B1 | 6/2008 | Gopalakrishnan |
| 7,420,242 B2 | 9/2008 | Lung |
| 7,851,849 B2 | 12/2010 | Kiyotoshi |
| 7,855,457 B2 | 12/2010 | Mizukami et al. |

(Continued)

FOREIGN PATENT DOCUMENTS

| | | |
|---|---|---|
| EP | 1936681 A1 | 6/2008 |
| EP | 2048709 A2 | 4/2009 |
| EP | 2192612 A2 | 6/2010 |

OTHER PUBLICATIONS

Choi et al., "Performance Breakthrough in NOR Flash Memory With Dopant-Segregated Schottky-Barrier (DSSB) SONOS Devices," Jun. 2009 Symposium on VLSI Technology Digest of Technical Papers, pp. 222-223.

(Continued)

*Primary Examiner* — Tu-Tu Ho
(74) *Attorney, Agent, or Firm* — Haynes Beffel & Wolfeld LLP

(57) ABSTRACT

A stepped substack interlayer connector structure on a multilayer integrated circuit includes N steps on the substrate from a surface of the substrate at a first level to a surface of the substrate at a second level. A stack of active layers alternating with insulating layers on the substrate, including a plurality of substacks disposed in relation to the N step(s) to form respective contact regions in which the substacks are disposed at a common level. Interlayer connectors are formed by conductors in the respective regions connected to landing areas on active layers in each of the plurality of substacks. The maximum depth of the interlayer connectors is equal to, or less than, the thickness of one of the substacks.

24 Claims, 31 Drawing Sheets

(56) References Cited

U.S. PATENT DOCUMENTS

| | | | |
|---|---|---|---|
| 8,383,512 | B2 | 2/2013 | Chen et al. |
| 8,541,882 | B2 | 9/2013 | Chen et al. |
| 8,598,023 | B2 | 12/2013 | Kawamoto |
| 8,598,032 | B2 | 12/2013 | Chen et al. |
| 8,633,099 | B1 | 1/2014 | Shih et al. |
| 8,736,069 | B2 | 5/2014 | Chiu et al. |
| 8,759,217 | B1 | 6/2014 | Chen |
| 8,759,899 | B1 | 6/2014 | Lue et al. |
| 2002/0106823 | A1 | 8/2002 | Hwang et al. |
| 2003/0064295 | A1 | 4/2003 | Yasuyuki et al. |
| 2004/0188822 | A1 | 9/2004 | Hara |
| 2005/0280061 | A1 | 12/2005 | Lee |
| 2007/0045708 | A1 | 3/2007 | Lung |
| 2007/0140001 | A1 | 6/2007 | Motoi et al. |
| 2008/0073635 | A1 | 3/2008 | Kiyotoshi et al. |
| 2008/0096327 | A1 | 4/2008 | Lee et al. |
| 2008/0101109 | A1 | 5/2008 | Haring-Bolivar et al. |
| 2008/0175032 | A1 | 7/2008 | Tanaka et al. |
| 2008/0180994 | A1 | 7/2008 | Katsumata et al. |
| 2008/0247230 | A1 | 10/2008 | Lee et al. |
| 2008/0285350 | A1 | 11/2008 | Yeh |
| 2009/0001530 | A1 | 1/2009 | Goto |
| 2009/0032966 | A1 | 2/2009 | Lee et al. |
| 2009/0097321 | A1 | 4/2009 | Kim et al. |
| 2009/0184360 | A1 | 7/2009 | Jin et al. |
| 2009/0310415 | A1 | 12/2009 | Jin et al. |
| 2010/0007001 | A1 | 1/2010 | Wang et al. |
| 2010/0054015 | A1 | 3/2010 | Lee et al. |
| 2010/0109164 | A1 | 5/2010 | Kang et al. |
| 2010/0133645 | A1 | 6/2010 | Dunne |
| 2010/0182041 | A1 | 7/2010 | Feng et al. |
| 2010/0225000 | A1 | 9/2010 | Sugizaki et al. |
| 2010/0270593 | A1 | 10/2010 | Lung et al. |
| 2011/0057321 | A1 | 3/2011 | Wang et al. |
| 2011/0309521 | A1 | 12/2011 | Dunne |
| 2012/0068241 | A1 | 3/2012 | Sakuma et al. |
| 2012/0184097 | A1 | 7/2012 | Chen et al. |
| 2013/0161835 | A1 | 6/2013 | Chen et al. |
| 2013/0277799 | A1 | 10/2013 | Chen et al. |
| 2013/0277852 | A1 | 10/2013 | Chen |
| 2014/0053979 | A1 | 2/2014 | Chen et al. |
| 2014/0061776 | A1* | 3/2014 | Kwon et al. ............ 257/329 |
| 2014/0191388 | A1 | 7/2014 | Chen |
| 2015/0069616 | A1* | 3/2015 | Oh et al. ............ 257/773 |

OTHER PUBLICATIONS

Extended European Search Report for related application EP 12170759, Feb. 5, 2013, 12 pp.

Fukuzumi et al. "Optimal Integration and Characteristics of Vertical Array Devices for Ultra-High Density, Bit-Cost Scalable Flash Memory," IEEE Dec. 2007, pp. 449-452.

Hsu et al., "Study of Sub-30nm Thin Film Transistor (TFT) Charge-Trapping (CT) Devices for 3D NAND Flash Application," 2009 IEEE, Dec. 7-9, 2009, pp. 27.4.1-27.4.4.

Hubert et al., "A Stacked SONOS Technology, Up to 4 Levels and 6nm Crystalline Nanowires, With Gate-All-Around or Independent Gates (Flash), Suitable for Full 3D Integration," IEEE 2009, Dec. 7-9, 2009, pp. 27.6.1-27.6.4.

Jang et al., "Vertical Cell Array Using TCAT (Terabit Cell Array Transistor) Technology for Ultra High Density NAND Flash Memory," 2009 Symposium on VLSI Technology Digest of Technical Papers, Jun. 16-18, 2009, pp. 192-193.

Johnson et al., "512-Mb PROM With a Three-Dimensional Array of Diode/Antifuse Memory Cells," IEEE Journal of Solid-State Circuits, vol. 38, No. 11, Nov. 2003, pp. 1920-1928.

Jung et al., "Three Dimensionally Stacked NAND Flash Memory Technology Using Stacking Single Crystal Si Layers on ILD and TANOS Structure for Beyond 30nm Node," IEEE IEDM, Dec. 11-13, 2006, 4 pages.

Katsumata et al., "Pipe-shaped BiCS Flash Memory With 16 Stacked Layers and Multi-Level-Cell Operation for Ultra High Density Storage Devices," 2009 Symposium on VLSI Technology Digest of Technical Papers, Jun. 16-18, 2009, pp. 136-137.

Kim et al. "Novel Vertical-Stacked-Array-Transistor (VSAT) for Ultra-High-Density and Cost-Effective NAND Flash Memory Devices and SSD (Solid State Drive)", Jun. 2009 Symposium on VLSI Technology Digest of Technical Papers, pp. 186-187.

Kim et al., "Multi-Layered Vertical Gate NAND Flash Overcoming Stacking Limit for Terabit Density Storage," 2009 Symposium on VLSI Technology Digest of Technical Papers, Jun. 16-18, 2009, pp. 188-189.

Kim et al., "Novel 3-D Structure for Ultra High Density Flash Memory with VRAT (Vertical-Recess-Array-Transistor) and PIPE (Planarized Integration on the same PlanE)," IEEE 2008 Symposium on VLSI Technology Digest of Technical Papers, Jun. 17-19, 2008, pp. 122-123.

Lai et al., "A Multi-Layer Stackable Thin-Film Transistor (TFT) NAND-Type Flash Memory," Electron Devices Meeting, 2006, IEDM '06 International, Dec. 11-13, 2006, pp. 1-4.

Lai et al., "Highly Reliable MA BE-SONOS (Metal—Al2 O3 Bandgap Engineered SONOS) Using a SiO2 Buffer Layer," VLSI Technology, Systems and Applications, 2008, VLSI-TSA 2008 International Symposium on Apr. 21-23, 2008, pp. 58-59.

Lue et al., "A Novel Buried-Channel FinFET BE-SONOS NAND Flash With Improved Memory Window and Cycling Endurance," 2009 Symposium on VLSI Technology Digest of Technical Papers, Jun. 16-18, 2009, pp. 224-225.

Paul et al., "Impact of a Process Variation on Nanowire and Nanotube Device Performance," IEEE Trans. on Electron Devices, vol. 54, No. 9, Sep. 2007, pp. 2369-2376.

Tanaka et al., "Bit Cost Scalable Technology with Punch and Plug Process for Ultra High Density Flash Memory," VLSI Technology, 2007 IEEE Symposium on Jun. 12-14, 2007, pp. 14-15.

U.S. Appl. No. 13/867,905, Inventor Shih-Hung Chen, filed Apr. 22, 2013, 50 pages.

* cited by examiner

3D STACKED IC DEVICE WITH STEPPED SUBSTACK INTERLAYER CONNECTORS

BACKGROUND OF THE INVENTION

1. Field of the Invention

The present invention relates to interlayer connectors for multi-layer integrated circuits and the like, including high density three-dimensional (3D) memory devices.

2. Description of Related Art

In the manufacturing of high density memory devices, the amount of data per unit area on an integrated circuit can be a critical factor. Thus, as the critical dimensions of the memory devices approach lithographic technology limits, techniques for stacking multiple levels or layers of memory cells have been proposed in order to achieve greater storage density and lower costs per bit.

For example, thin film transistor techniques are applied to charge trapping memory in Lai, et al., "A Multi-Layer Stackable Thin-Film Transistor (TFT) NAND-Type Flash Memory," IEEE Int'l Electron Devices Meeting, 11-13 Dec. 2006; and in Jung et al., "Three Dimensionally Stacked NAND Flash Memory Technology Using Stacking Single Crystal Si Layers on ILD and TANOS Structure for Beyond 30 nm Node," IEEE Int'l Electron Devices Meeting, 11-13 Dec. 2006.

Also, cross-point array techniques have been applied for anti-fuse memory in Johnson et al., "512-Mb PROM With a Three-Dimensional Array of Diode/Anti-fuse Memory Cells," IEEE J. of Solid-State Circuits, Vol. 38, No. 11, November 2003. See, also U.S. Pat. No. 7,081,377 to Cleeves entitled "Three-Dimensional Memory."

Another structure that provides vertical NAND cells in a charge trapping memory technology is described in "Novel 3-D Structure for Ultra-High Density Flash Memory with VRAT and PIPE," by Kim et al., 2008 Symposium on VLSI Technology Digest of Technical Papers;" 17-19 Jun. 2008; pages 122-123.

In three-dimensional (3D) stacked memory devices, conductive interconnects used to couple the lower layers of memory cells to decoding circuitry and the like pass through the upper layers. The cost to implement the interconnections increases with the number of lithographic steps needed. One approach to reduce the number of lithographic steps is described in Tanaka et al., "Bit Cost Scalable Technology with Punch and Plug Process for Ultra High Density Flash Memory," 2007 Symposium on VLSI Technology Digest of Technical Papers; 12-14 Jun. 2007; pages 14-15.

Technology is being developed to reduce the number of lithographic mask steps required to establish contacts at each contact level. For example, U.S. Pat. No. 8,598,023 and U.S. Pat. No. 8,383,512 disclose what can be referred to as binary sum systems for forming interlayer connectors extending to the conductive layers of a stack of active layers interleaved with insulating layers. These two just mentioned patents are incorporated by reference as if fully set forth herein. Also, ternary and quaternary sum processes have been developed.

In a binary sum system etch process, M etch masks can be used in the creation of interlayer connectors to $2^M$ active layers. Also, in other examples, M etch masks can be used to create interlayer connectors to $N^M$ conductive layers, with N being an integer greater than or equal to 3. Therefore, with N equal to 3, only 3 etch masks are needed to form interlayer connectors to landing areas at 27 conductive layers. This is achieved by etching, trimming the etch mask and etching again using the trimmed etch mask. The selection of N reflects the number of times each etch mask is trimmed with N=3 for one trim step, N=4 for two trim steps, etc. Therefore, there is an initial etch step, a trim step, and an etch step following each trim step. With N=3, the process can be referred to as a ternary system. For example, with a quaternary system, so that N=4 reflecting two trim steps, 3 masks (M=3) can be used to create interlayer connectors to landing areas at $4^3$ or 64 conductive layers, while 4 masks (M=4) can be used to create interlayer connectors to landing areas at $4^4$ or 256 conductive layers.

Other processes to form the required interlayer connectors can also be used. However, limitations can arise as the number of layers increases, because not only does the number of etch steps increase even using binary system etch approaches, but also the depths of the required vias increase. With greater depths, the layout area for each interlayer connector can increase and process control issues arise.

Thus it is desirable to provide a technology that can improve the reliability and reduce the costs of manufacturing for interlayer connectors in multilayer integrated circuts such as 3D memory.

SUMMARY

A stepped substack interlayer connector structure on a multilayer device includes N steps on the substrate from a surface of the substrate at a first level to a surface of the substrate at a second level. A stack of active layers, alternating with insulating layers on the substrate, including a plurality of substacks disposed in relation to the N step(s) to form respective contact regions in which the substacks are disposed at a common level. Interlayer connectors are formed by conductors in the respective regions connected to landing areas on active layers in each of the plurality of substacks. The maximum depth of the interlayer connectors is equal to, or less than, the thickness of one of the substacks.

3D integrated circuits and memory devices including the stepped substack interlayer connector structure are described. Also, manufacturing processes for forming the stepped substack interlayer connector structure are described.

Other aspects and advantages of the present invention can be seen on review of the drawings, the detailed description and the claims, which follow.

DETAILED DESCRIPTION

A detailed description of embodiments of the present invention is provided with reference to the FIGS. 1-31.

Figure 1:
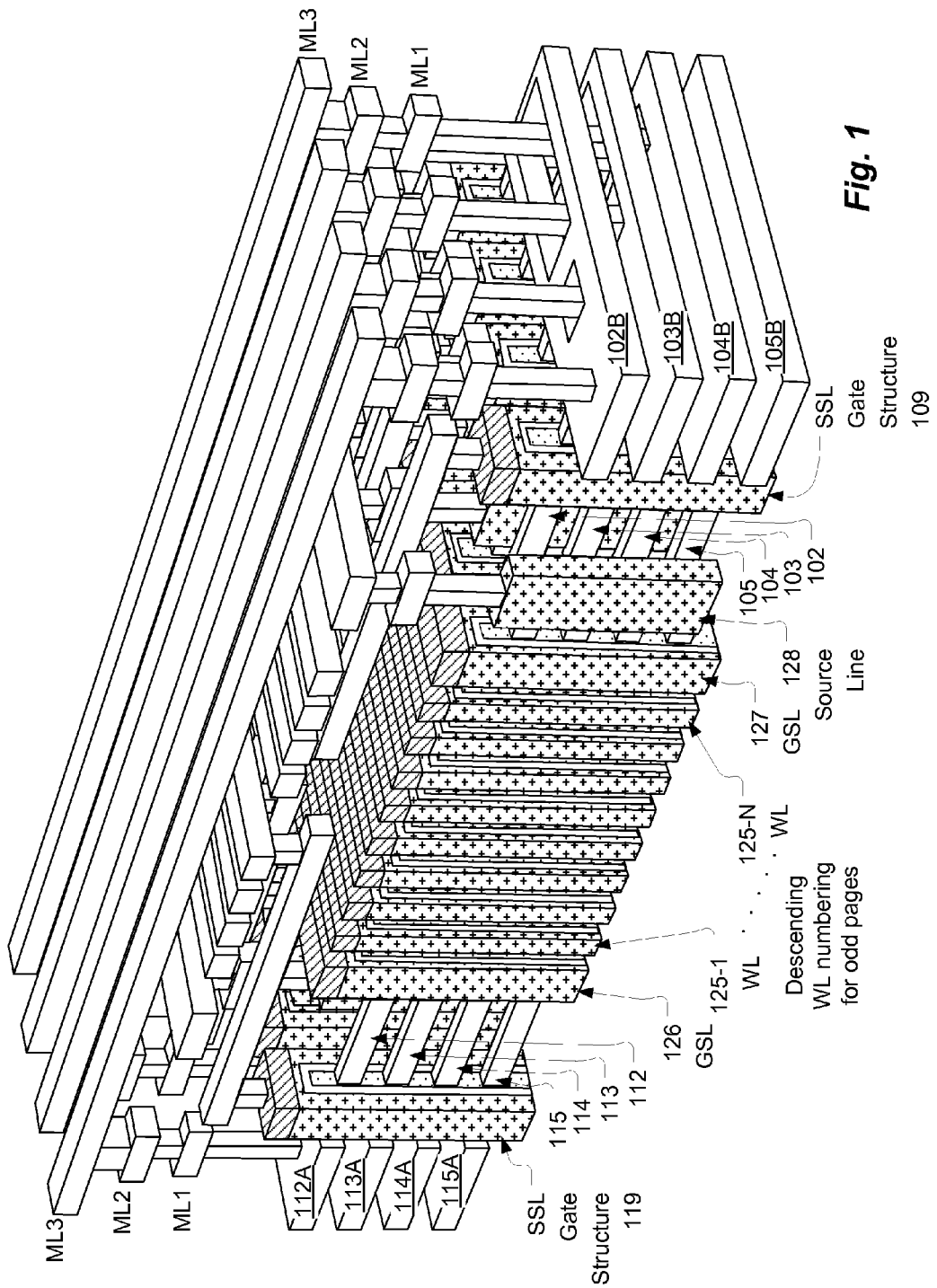
FIG. 1 is a perspective illustration of a three-dimensional, vertical gate NAND-flash memory device.

FIG. 1 is a perspective illustration of a three-dimensional (3D) NAND-flash memory device which includes contact pads at which interlayer connectors contact the corresponding active layers. The device illustrated in FIG. 1 includes stacks of active lines in active layers of the array, alternating with insulating lines. Insulating material is removed from the drawing to expose additional structure. For example, insulating lines are removed between the semiconductor lines in the stacks, and between the stacks of semiconductor lines. This structure is described herein in some detail, as an example of a three-dimensional (3D) memory array which can be manufactured in a recessed area, or pit, on a semiconductor substrate, in combination with peripheral circuits on the substrate outside of the pit. In some embodiments, the structure shown in FIG. 1 is not manufactured in a pit in the substrate.

Other multilayer circuit structures can also be formed using the technology described herein.

In the example shown in FIG. 1, a multilayer array is formed on an insulating layer, and includes a plurality of word lines 125-1, . . . , 125-N conformal with the plurality of stacks. The plurality of stacks includes semiconductor lines 112, 113, 114, and 115 in multiple planes. Semiconductor lines in the same plane are electrically coupled together by bit line contact pads (e.g. 102B).

Bit line contact pads 112A, 113A, 114A, and 115A on the near end of the figure terminate semiconductor lines, such as semiconductor lines 112, 113, 114, and 115. As illustrated, these bit line contact pads 112A, 113A, 114A, and 115A are electrically connected by interlayer connectors to different bit lines in an overlying patterned metal layer, e.g. ML3, for connection to decoding circuitry to select planes within the array. These bit line contact pads 112A, 113A, 114A, and 115A can be formed over stepped substrate structures as discussed below, and patterned at the same time that the plurality of stacks is defined.

Bit line contact pads 102B, 103B, 104B, and 105B on the far end of the figure terminate semiconductor lines, such as semiconductor lines 102, 103, 104, and 105. As illustrated, these bit line contact pads 102B, 103B, 104B, and 105B are electrically connected by interlayer connectors to different bit lines in an overlying patterned metal layer, e.g. ML3, for connection to decoding circuitry to select planes within the array. These bit line contact pads 102B, 103B, 104B, and 105B can be formed over stepped substrate structures as discussed below, and patterned at the same time that the plurality of stacks is defined.

In this example, any given stack of semiconductor lines is coupled to either the bit line contact pads 112A, 113A, 114A, and 115A, or the bit line contact pads 102B, 103B, 104B, and 105B, but not both. A stack of semiconductor bit lines has one of the two opposite orientations of bit line end-to-source line end orientation, or source line end-to-bit line end orientation. For example, the stack of semiconductor lines 112, 113, 114, and 115 has bit line end-to-source line end orientation; and the stack of semiconductor lines 102, 103, 104, and 105 has source line end-to-bit line end orientation.

The stack of semiconductor lines 112, 113, 114, and 115 terminated by the bit line contact pads 112A, 113A, 114A, and 115A, passes through SSL gate structure 119, ground select line GSL 126, word lines 125-1 WL through 125-N WL, ground select line GSL 127, and is terminated at the other end by source line 128. The stack of semiconductor lines 112, 113, 114, and 115 does not reach the bit line structures 102B, 103B, 104B, and 105B.

The stack of semiconductor lines 102, 103, 104, and 105 terminated by the bit line contact pads 102B, 103B, 104B, and 105B, passes through SSL gate structure 109, ground select line GSL 127, word lines 125-N WL through 125-1 WL, ground select line GSL 126, and is terminated at the other end by a source line (obscured by other parts of the figure). The stack of semiconductor lines 102, 103, 104, and 105 does not reach the bit line structures 112A, 113A, 114A, and 115A.

A layer of memory material is disposed in interface regions at cross-points between surfaces of the semiconductor lines 112-115 and 102-105 and the plurality of word lines 125-1 through 125-n. Ground select lines GSL 126 and GSL 127 are conformal with the plurality of stacks, similar to the word lines.

Every stack of semiconductor lines is terminated at one end by bit line contact pads and at the other end by a source line. For example, the stack of semiconductor lines 112, 113, 114, and 115 is terminated by bit line contact pads 112A, 113A, 114A, and 115A, and terminated on the other end by a source line 128.

Bit lines and string select lines are formed at the metal layers ML1, ML2, and ML3. Bit lines are coupled to a plane decoder (not shown) in the peripheral area on the circuit. String select lines are coupled to a string select line decoder (not shown) in the peripheral area on the circuit.

The ground select lines GSL 126 and 127 can be patterned during the same step that the word lines 125-1 through 125-$n$ are defined. Ground select devices are formed at cross-points between surfaces of the plurality of stacks and ground select lines GSL 126 and 127. The SSL gate structures 119 and 109 can be patterned during the same step that the word lines 125-1 through 125-$n$ are defined. String select devices are formed at cross-points between surfaces of the plurality of stacks and string select (SSL) gate structures 119 and 109. These devices are coupled to decoding circuitry for selecting the strings within particular stacks in the array.

Figure 2:
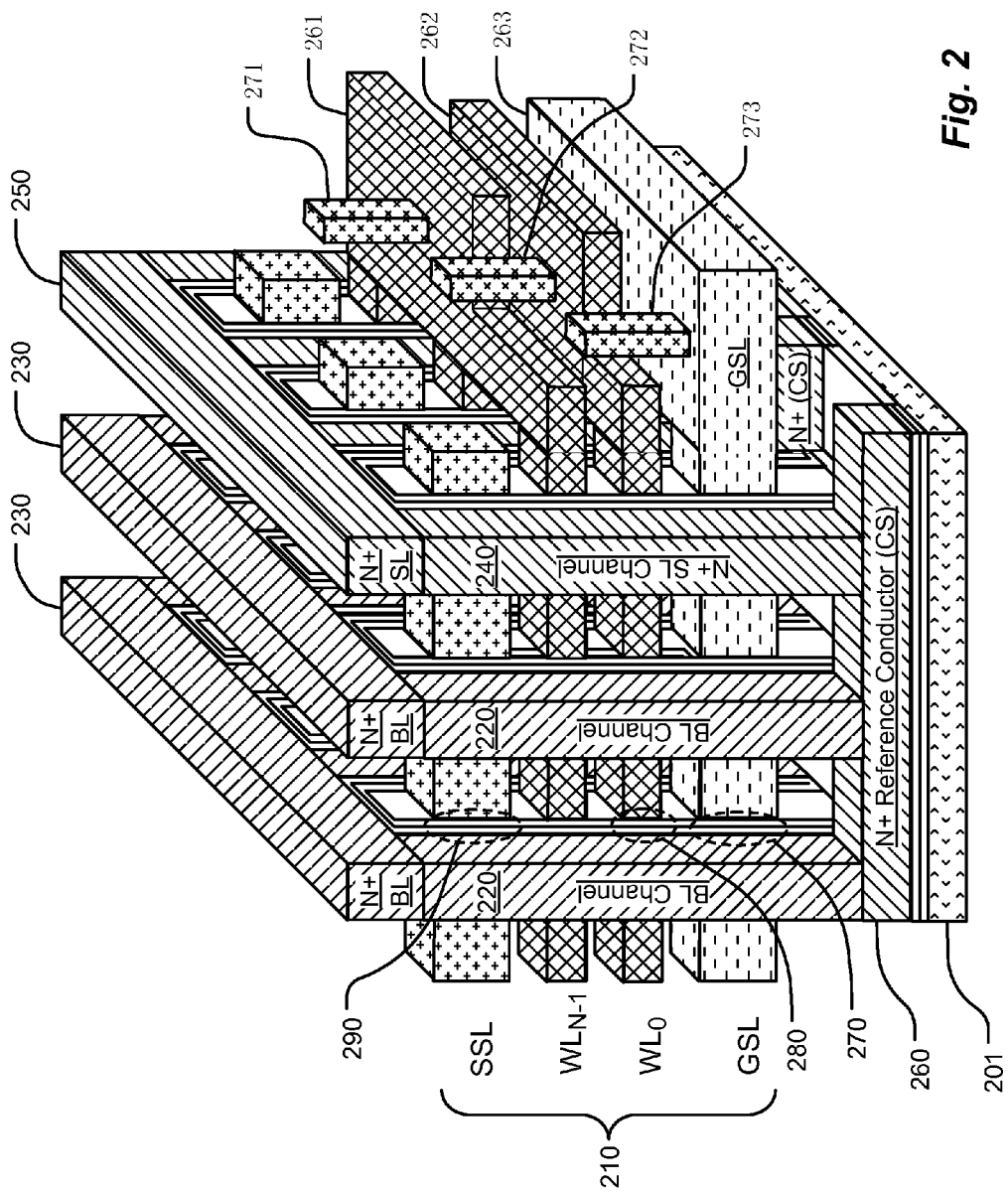
FIG. 2 is a perspective illustration of an alternative three-dimensional, vertical channel NAND-flash memory device.

FIG. 2 is a perspective illustration of an alternative three-dimensional, vertical channel NAND-flash memory device which includes contact pads at which interlayer connectors contact the corresponding active layers. The memory device includes an array of NAND strings of memory cells, and can be a double-gate vertical channel memory array (DGVC). The memory device includes an integrated circuit substrate 201, and a plurality of stacks of conductive strips alternating with insulating material. The stacks include at least a bottom plane of conductive strips (GSL), a plurality of intermediate planes of conductive strips (WLs), and a top plane of conductive strips (SSLs). For example, a stack 210 includes a bottom plane of conductive strips (GSL), a plurality of intermediate planes of conductive strips (WLs) ranging from $WL_0$ to $WL_{N-1}$, and a top plane of conductive strips (SSLs), where N can be 8, 16, 32, 64 and so on. The insulating material is removed from the drawing to expose additional structure. For example, the insulating material is removed between the conductive strips in the stacks, and is removed between the stacks of conductive strips.

In the example shown in FIG. 2, a plurality of bit line structures is arranged orthogonally over, having surfaces conformal with, the plurality of stacks, including inter-stack semiconductor body elements 220 between the stacks and linking elements 230 over the stacks connecting the semiconductor body elements 220.

The memory device includes memory elements in interface regions at cross-points 280 between side surfaces of the conductive strips in the plurality of intermediate planes (WLs) in the stacks and the inter-stack semiconductor body elements 220 of the plurality of bit line structures.

A reference conductor 260 is disposed between the bottom plane (GSL) of conductive strips and the integrated circuit substrate 201. At least one reference line structure is arranged orthogonally over the plurality of stacks, including inter-stack semiconductor elements 240 between the stacks in electrical communication with the reference conductor 260, and linking elements 250 over the stacks 210 connecting the inter-stack semiconductor elements 240. The semiconductor elements 240 can have a higher conductivity than the semiconductor body elements 220.

The memory device includes string select switches 290 at interface regions with the top plane of conductive strips, and reference select switches 270 at interface regions with the bottom plane (GSL) of conductive strips.

In the example shown in FIG. 2, the memory device can further include decoding circuitry coupled to the conductive strips in the plurality of stacks. The decoding circuitry can include word line decoding circuits, and string selection line decoding circuits coupled to the top plane of conductive strips (SSLs) in the plurality of stacks. String selection lines in the top plane of conductive strips are independently coupled to and controlled by the string selection line decoding circuits.

Conductive strips in the intermediate planes (WLs), and conductive strips in the bottom plane (GSL) are connected together to reduce decoder areas and consequently an overall size of the memory device. Conductive strips in the top plane (SSL) are individually decoded to allow correct bit line decoding.

The memory device can include contact pads which provide linking elements, such as contact pads 261 and 262, connecting sets of word lines in the intermediate planes (WL), and interlayer connectors, such as interlayer connectors 271 and 272, coupled to landing areas in the contact pads 261 and 262, and to the word line decoding circuits (not shown). The landing areas are at interface regions between bottom surfaces of the interlayer connectors and top surfaces of the contact pads.

In the example shown in FIG. 2, interlayer connectors (e.g. 271 and 272) for sets of word lines at multiple layers in the plurality of intermediate planes are arranged in a staircase structure, and are connected to landing areas at two different layers in the plurality of intermediate planes. The contact pads can be formed over a stepped substrate structure as described below.

The staircase structure can be formed in a vertical contact region (e.g. 314 in FIG. 3) near the boundary of a memory cell region (e.g. 312 in FIG. 3) for the array of memory cells and a peripheral region (e.g. 318 in FIG. 3) for components of peripheral circuits. The vertical contact region can include contact pads 261 and 262, and interlayer connectors 271 and 272.

The memory device can include ground selection line decoding circuits coupled to the at least one bottom plane (GSL) of conductive strips in the plurality of stacks. The memory device can include contact pads, such as a contact pad 263, connecting sets of ground selection lines in the bottom plane (GSL) of conductive strips, and interlayer connectors, such as an interlayer connector 273, coupled to landing areas in the contact pads, and to the ground selection line decoding circuits (not shown).

In the example shown in FIG. 2, the memory device includes a first overlying conductive layer (not shown) connected to the plurality of bit line structures, including a plurality of global bit lines coupled to sensing circuits. The memory device also includes a second overlying conductive layer (not shown) connected to the at least one reference conductor structure, coupled to a reference voltage source.

Three-dimensional memory (3D) devices, such as the ones illustrated by FIG. 1 and FIG. 2, as well as other structures of three-dimensional (3D) memory devices involving stacks of active layers alternating with insulating layers, include components of peripheral circuits in addition to stacks of active lines alternating with insulating lines described herein. Components of peripheral circuits can be manufactured on a planar surface of a substrate of an integrated circuit device to control function of the device. In some examples, the stacks can be manufactured in a pit in the substrate below the planar surface.

Insulating layers in the stack can be the same as or different from the other layers. Representative insulating materials that can be used include a silicon oxide, a silicon nitride, a silicon oxynitride, silicate, or other materials. Low dielectric constant (low-k) materials having a dielectric constant smaller than that of silicon dioxide, such as $SiCHO_x$, can be used. High dielectric constant (high-k) materials having a dielectric constant greater than that of silicon dioxide, such as $HfO_x$, HfON, $AlO_x$, $RuO_x$, $TiO_x$, can be used also.

Conductor or semiconductor layers in the stack can be the same as or different from the other layers. Representative materials that can be used include semiconductors including undoped and doped polysilicon (using dopants such as As, P, B), combinations of semiconductor structures, silicides including TiSi, CoSi, oxide semiconductors, including InZnO, InGaZnO, and combinations of semiconductors and silicides. Conductive layers in the stack can also be a metal, a conductive compound, or combinations of materials including Al, Cu, W, Ti, Co, Ni, TiN, TaN, TaAlN, and others.

Figure 3:
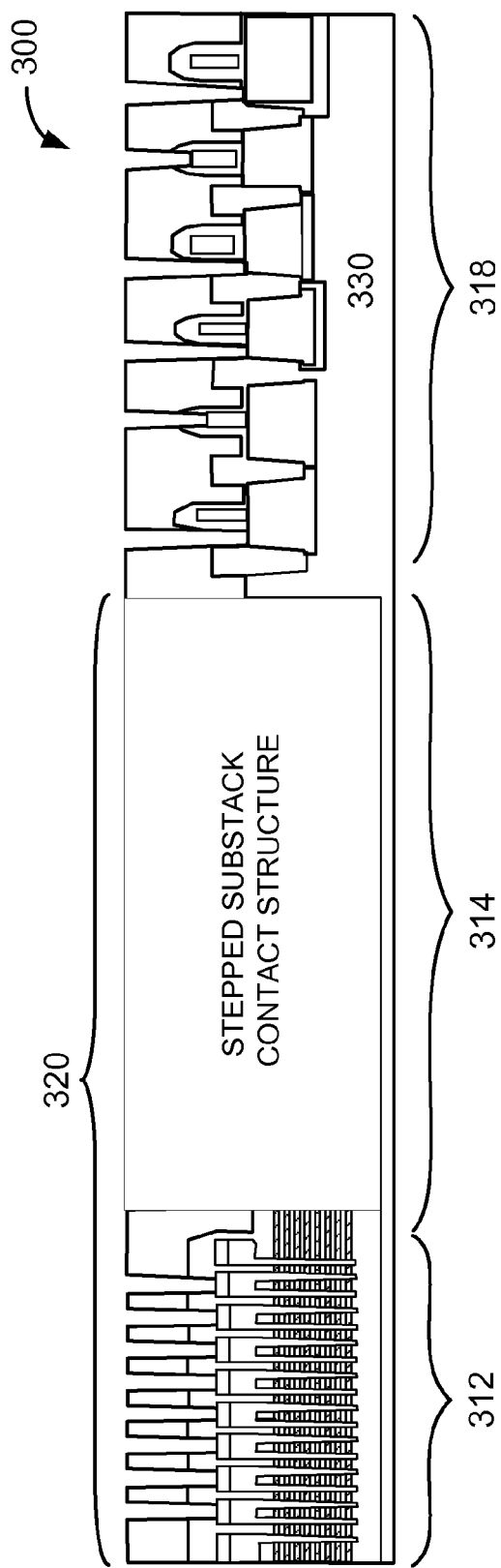
FIG. 3 is a simplified cross section of a 3D memory, where the memory structures are formed in a pit in a semiconductor substrate.

FIG. 3 is a simplified cross-sectional view of one example of a three-dimensional (3D) memory device 300 including a memory cell region 312, a vertical contact region 314 and a peripheral region 318. The memory cell region 312 includes a stack of active layers alternating with insulating layers, where the active layers can include patterned semiconductor or conductive materials used as bit lines or word lines in a memory, and the insulating layers can include dielectric materials. The active layers and the insulating layers are disposed in a recessed area, or a pit, on the substrate in this example. The vertical contact region 314 includes contact pads arranged in a stepped substack configuration, as described below, and interlayer connectors to connect the active layers in the memory cell region 312 to overlying metal layers. An isolation region (not shown) can electrically insulate the memory cell region 312 and the vertical contact region 314 from the peripheral region 318. The peripheral region 318 includes components of peripheral circuits including decoding circuitry, connected to circuit elements in the memory cell region 312 and the vertical contact region 314 via the overlying metal layers.

In the example shown in FIG. 3, the memory cell region 312 and the vertical contact region 314 are in a pit 320 in a substrate 330. The memory cell region 312 can include semiconductor lines 112-115 and 102-105, SSL gate structures 119 and 109, ground select lines GSL 126 and 127, word lines 125-1 WL through 125-N WL, ground select lines GSL 127 and 126, and source line 128, as illustrated in FIG. 1.

The vertical contact region 314 can include bit line contact pads 102B, 103B, 104B, and 105B, and bit line contact pads 112A, 113A, 114A, and 115A, connected to bit lines at metals layers ML1, ML2, and ML3, as illustrated in FIG. 1. In reference to the memory device illustrated in FIG. 2, the vertical contact region 314 can include contact pads 261 and 262 that connect sets of word lines in the intermediate planes (WL), and interlayer connectors 271 and 272 that are coupled to landing areas in the contact pads 261 and 262, and to the word line decoding circuits (not shown). In reference to the memory device illustrated in FIG. 2, the vertical contact region 314 can also include the contact pads 263 that connect sets of ground selection lines in the bottom plane (GSL) of conductive strips, and interlayer connectors 273 that are coupled to landing areas in the contact pads 263, and to the ground selection line decoding circuits (not shown).

Components of peripheral circuits in the peripheral region 318 can include the decoding circuitry such as described for the memory devices illustrated in FIG. 1 and FIG. 2. Overlying patterned conductor layers (not shown) can connect the interlayer connectors in the contact region to circuits in the peripheral region. For instance, the decoding circuitry as described for the memory device illustrated in FIG. 2 can include word line decoding circuits, string selection line decoding circuits, and ground selection line decoding circuits. Components of the peripheral circuits can also include controllers, voltage generators, address generators, command decoders, gates, patterned metal layers, and vias connecting patterned metal layers with other components. The components of the peripheral circuits can be manufactured with CMOS (complementary metal-oxide-semiconductor) technology.

A planarized surface can be formed over the memory cell region 312, the vertical contact region 314, and the peripheral region 318. Patterned metal layers can be formed over the planarized surface. In reference to the memory device illustrated in FIG. 1, the patterned metal layers can include metals layers ML1, ML2, and ML3. In reference to the memory device illustrated in FIG. 2, the patterned metal layers can include the first overlying conductive layer (not shown) connected to the plurality of bit line structures, and the second overlying conductive layer (not shown) connected to the reference conductor structure. The patterned metal layers can couple the components of the peripheral circuits in the peripheral region 318 to the memory cells in the memory cell region 312. The patterned metal layers can couple the components of the peripheral circuits in the peripheral region 318 to bit line contact pads 102B, 103B, 104B, and 105B, 112A, 113A, 114A, and 115A (FIG. 1) in the vertical contact region 314. The patterned metal layers can couple the components of the peripheral circuits in the peripheral region 318 to interlayer connectors 271, 272 and 273 (FIG. 2) in the vertical contact region 314.

FIGS. 4 to 31 illustrate a sequence of stages of a process for manufacturing a stepped substack contact structure, suitable for use in the structure of FIGS. 1, 2 and 3. Also, the stepped substack contact structure can be applied in any multilayer circuit.

FIGS. 4-31 illustrate stages in manufacturing processes than can be used to form a stepped substack contact structure. Other manufacturing processes can be utilized as well. Also, the order of some of the manufacturing stages illustrated can be changed as desired in particular implementations.

Figure 4:
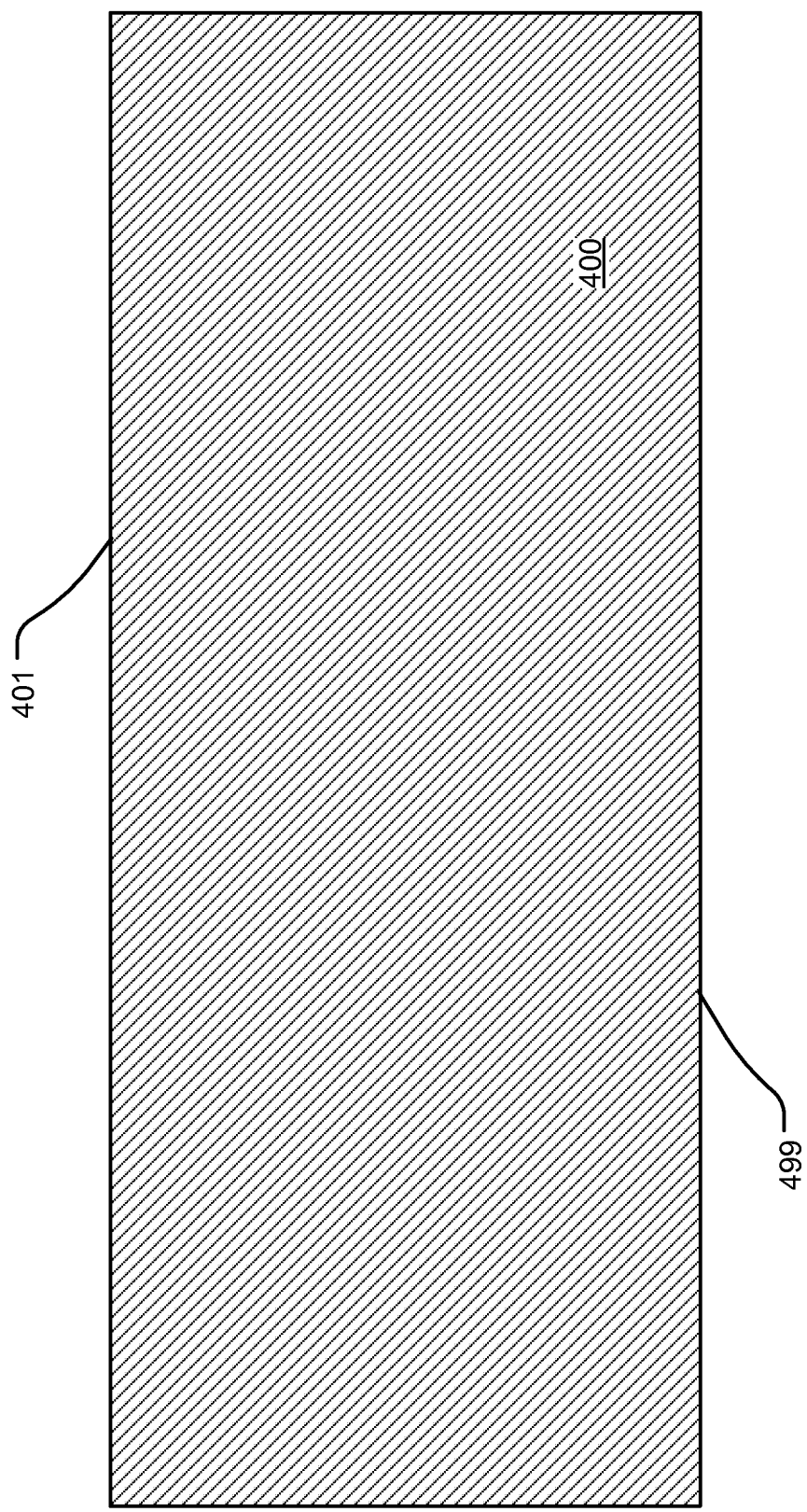
FIGS. 4-31 illustrate stages of manufacturing processes that can be utilized to form stepped substack interlayer connector structures.

FIG. 4 illustrates a first stage of the manufacturing processes showing one example of a layer on a substrate on which the stepped substack contact structure can be implemented. In this example, the substrate includes a relatively thick layer 400 of insulating material, such as silicon dioxide. Other materials can be utilized as well, including other insulators, semiconductors and so on. The layer 400 can be formed on a surface 499 of a semiconductor wafer. In some examples, the surface 499 lies in a pit, such as illustrated in FIG. 3. As illustrated in FIG. 4, the layer 400 has an upper surface 401.

Figure 5:
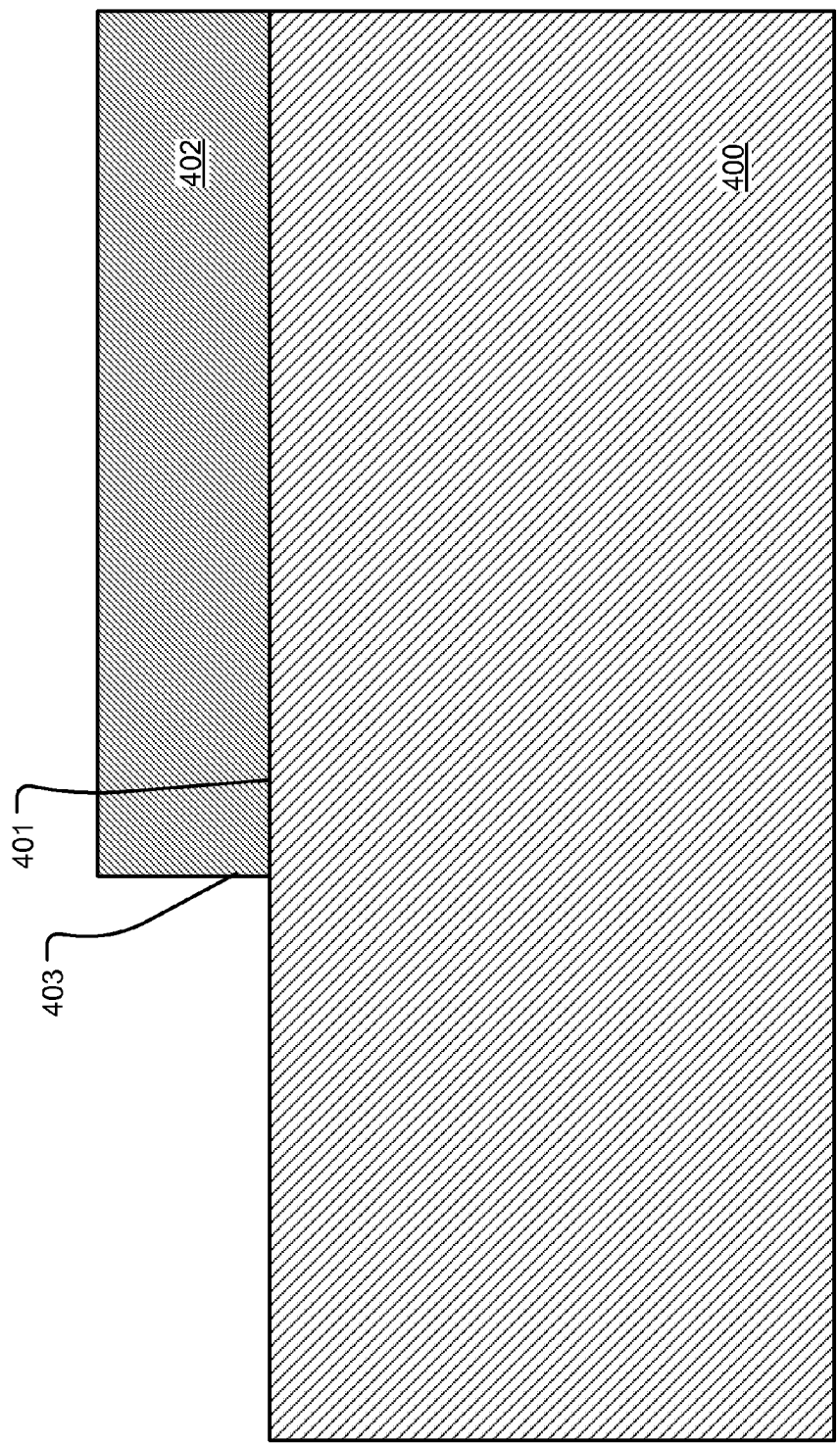

FIG. 5 illustrates a second stage in the manufacturing processes, in which a mask layer 402 of photoresist, for example, is formed and patterned on the surface 401 of the layer 400. As illustrated, the mask layer 402 is patterned to provide a line 403 over the layer 400 in the region of the stepped substack contact structure.

Figure 6:
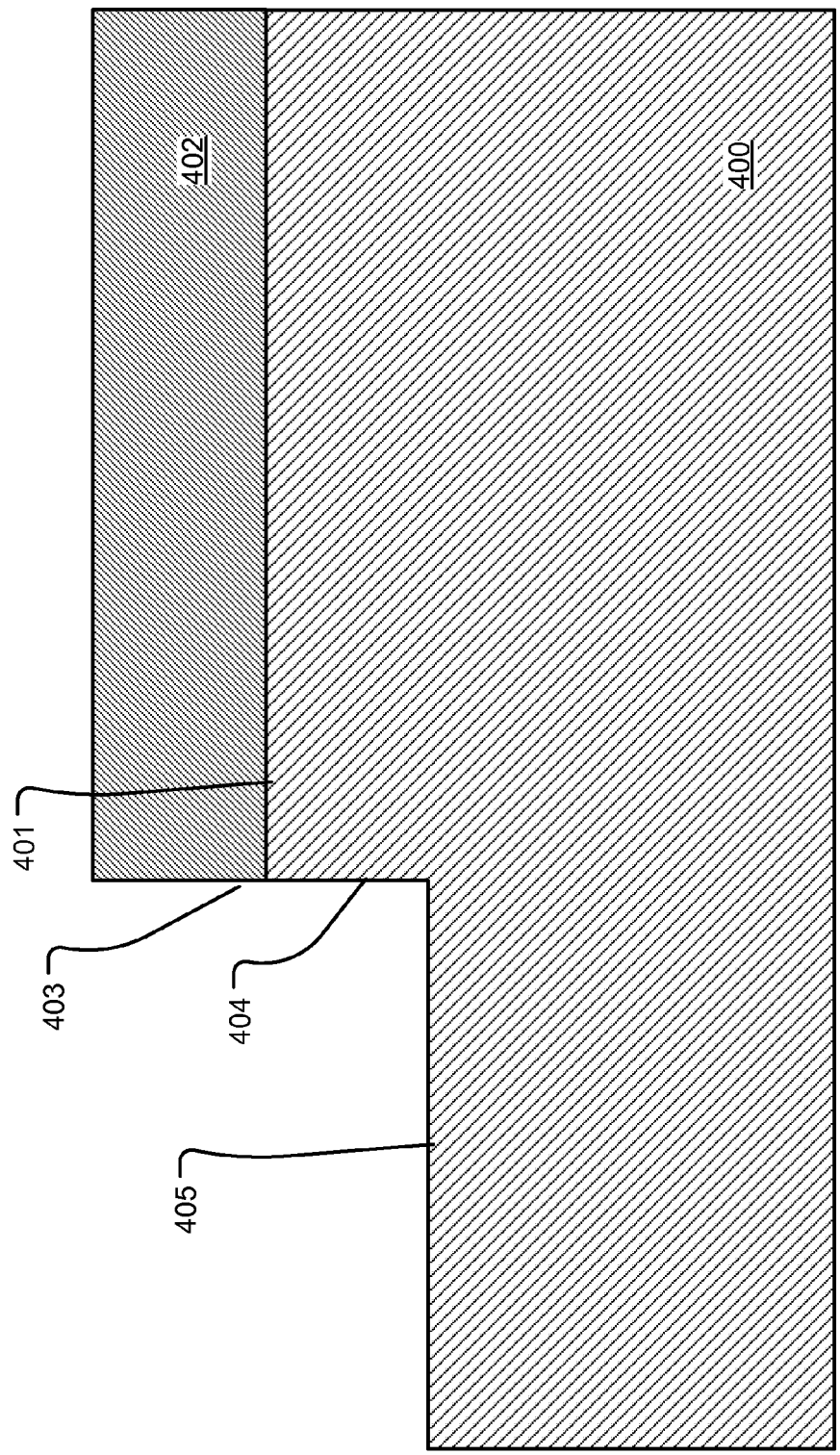

FIG. 6 illustrates a third stage, in which the mask layer 402 is used as an etch mask, and the layer 400 is etched anisotropically to form a preliminary pit having a bottom surface 405 at a level lower than the surface 401, and a side surface 404 aligned with the line 403 on the mask layer 402

Figure 7:
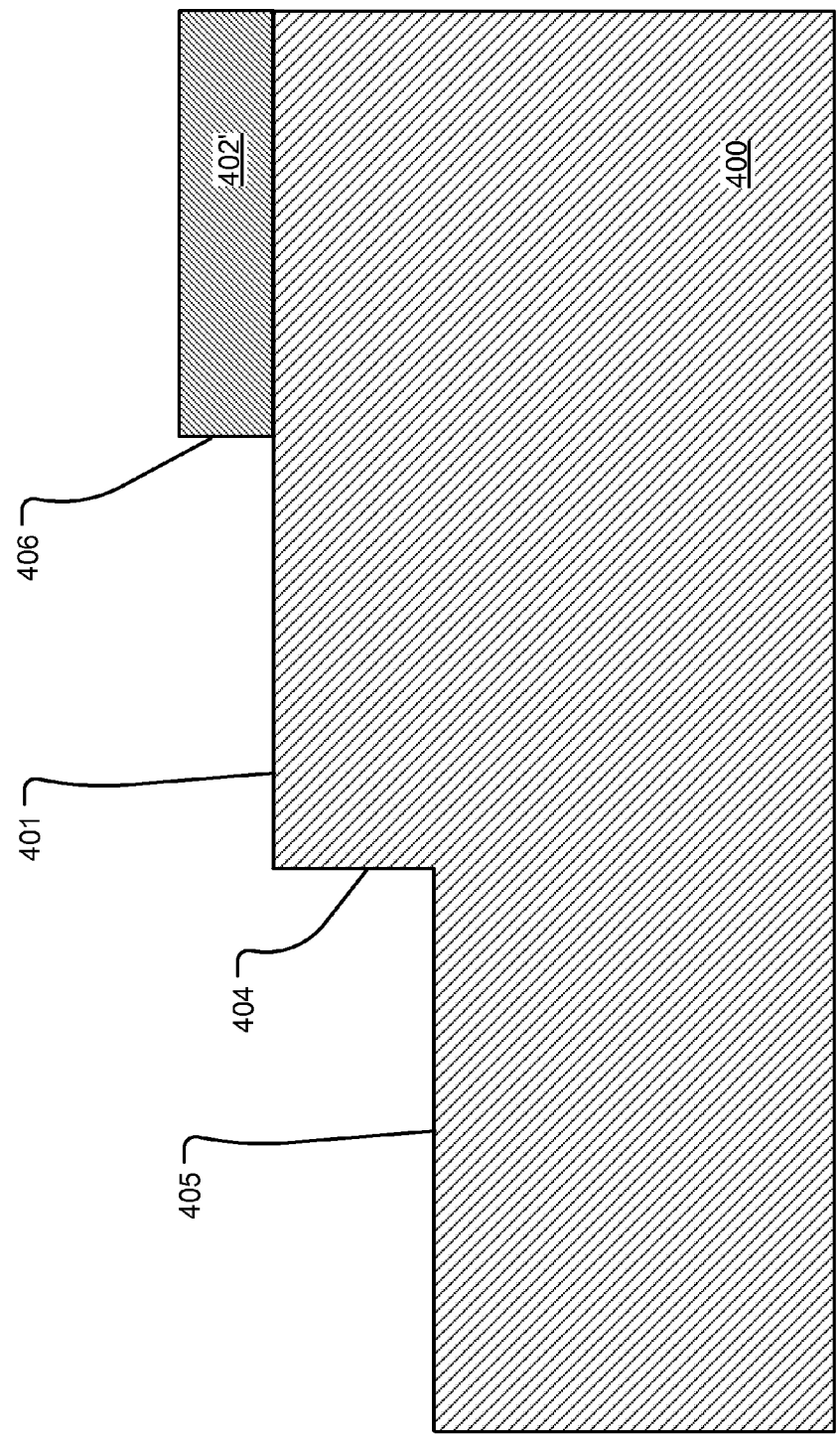

FIG. 7 illustrates a fourth stage after a process in which the mask layer 402 is trimmed forming modified mask layer 402'. If the mask layer 402 comprises a photoresist, one process for trimming can be an oxygen-based ashing process. The modified mask layer 402' exposes additional portion of the surface 401 of layer 400, and defines a line 406.

Figure 8:
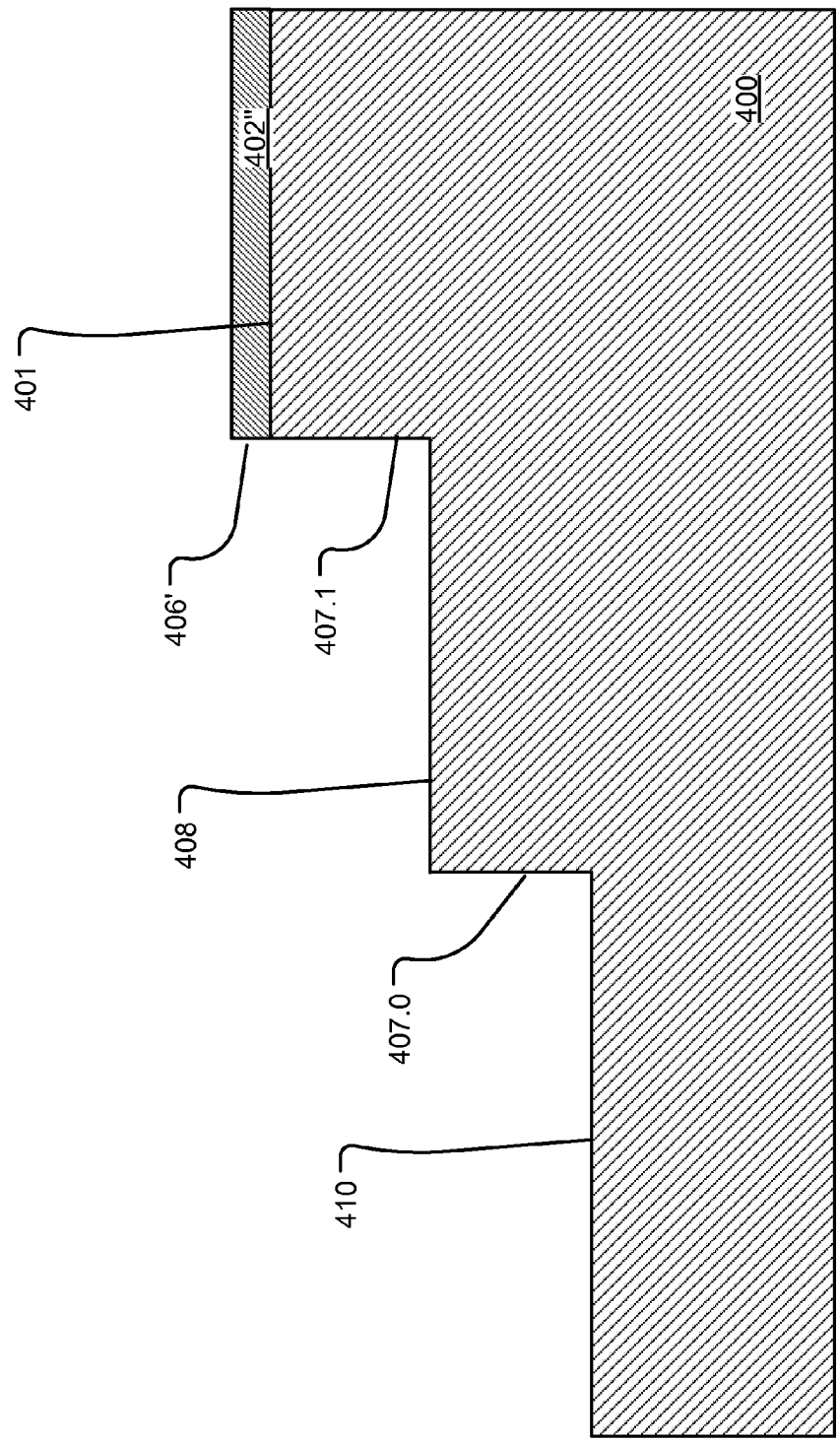

FIG. 8 illustrates the fifth stage in which the modified mask layer 402' is used as an etch mask, and the layer 400 is etched anisotropically to form a second preliminary pit having a stepped contour, including a bottom surface 410, a first side wall forming a rise 407.0 of a step aligned with the side 404 shown in FIG. 6, a second surface 408, and a second rise 407.1 of a step aligned with the line 406' of the remaining portion 402" of the mask layer 402.

Figure 9:
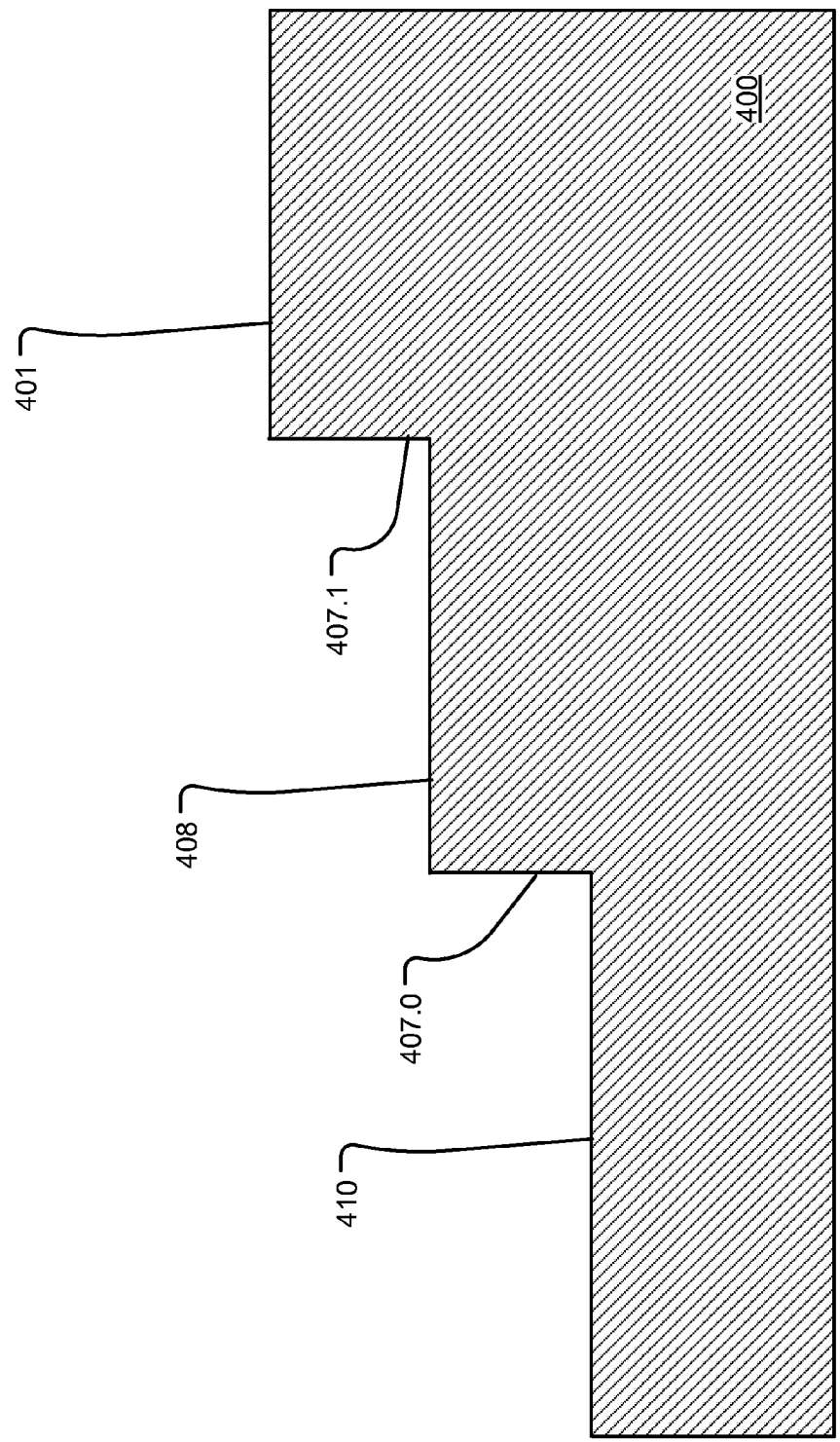

FIG. 9 illustrates a sixth stage in which the remaining portion 402" of the mask layer 402 is removed. As result of the first through sixth stages, a stepped structure is formed in the substrate 400. In this example, there are 2 stairs, each including a rise and a run. The first step begins at the layer 410, at a first level of the substrate. The rise 407.0 of the first step is on side of the etched layer 400. The run of the first step is at the surface 408. The rise 407.1 of the second step is on another side of the etched layer 400. The run of the second step is on the surface 401, at a second level of substrate. Thus, a plurality of steps are formed each having a rise and a run. The run of the last step is at an upper surface of the substrate layer 400. The rise of the first step begins on a bottom layer of the stepped substack contact structure.

The height of the rise for each step is designed to match with the substacks being formed as described below. In this example, a trim-etch process is used to form the stairstep structure using a single patterned photoresist deposition. In other examples, separate photolithographic steps can be used at each stage of the etching.

In this example, there are two steps illustrated. In other examples, the structure can be made using one step, or three steps or more as suits a particular design requirement.

Figure 10:
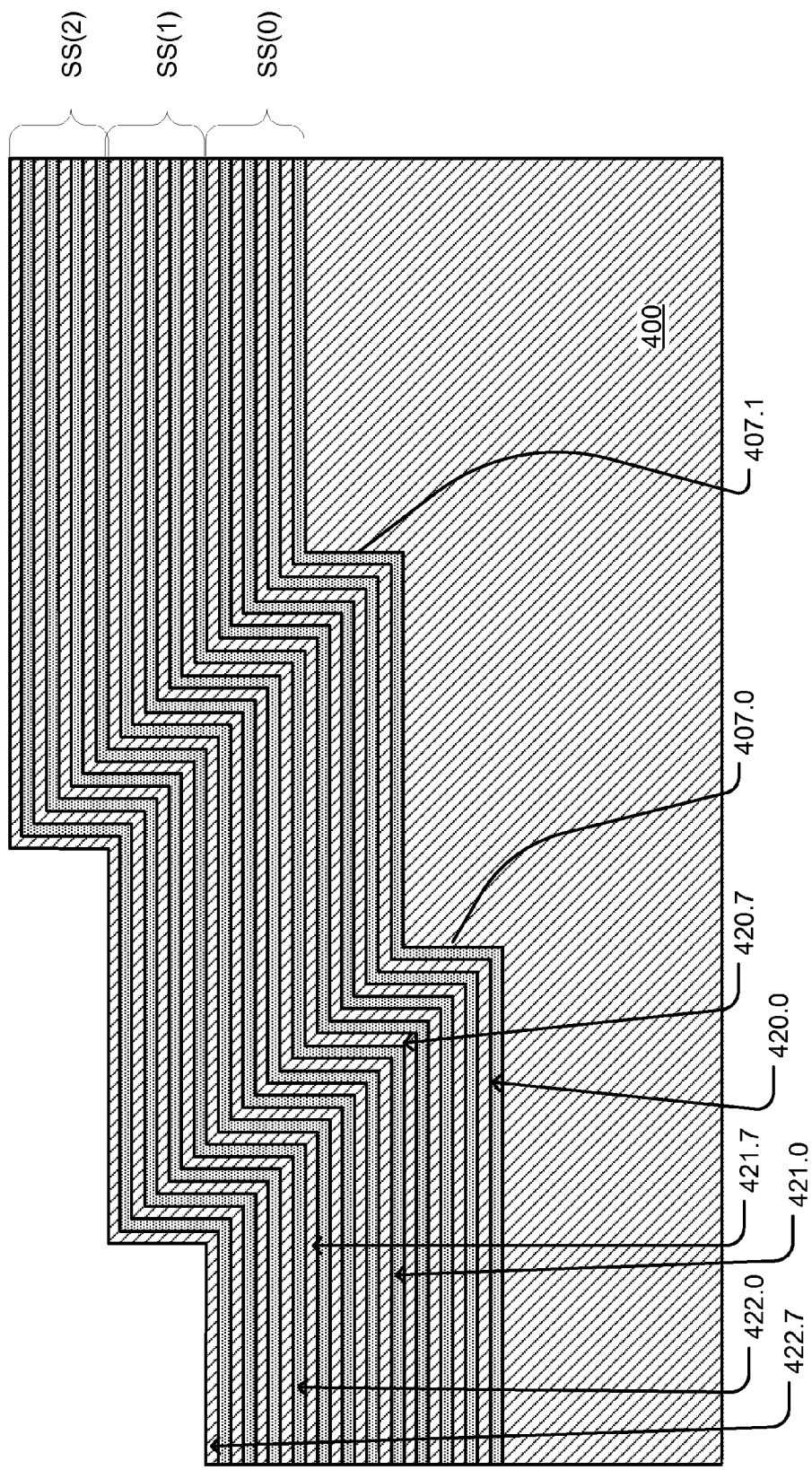

FIG. 10 illustrates a seventh stage in the manufacturing processes, after forming a stack of active layers alternating with insulating layers on the substrate. The active layers can for example comprise landing pad structures like the contact pads 102B, 103B, 104B and 105B shown in FIG. 1, or the contact pads 263, 262, and 261 shown in FIG. 2. Thus, for example, the active layers in the structure can comprise polysilicon, and the insulating layers can comprise silicon dioxide. Other materials can be utilized for the active and insulating layers as suits a particular design requirement.

The steps can be oriented to meet layout requirements of a particular design. For example, referring to FIG. 1, the lowermost step can be adjacent the semiconductor strips which act as the local bit lines, with each step succeeding further away from the strips so that the run of the steps is in the same direction as the stacks of semiconductor strips, and the width of the steps can be the same as the width of the block of memory cells. Alternatively, the run of the steps can be orthogonal to the stacks of semiconductor strips, and the width of the steps can be selected as needed to accommodate the interlayer connectors needed for the structure.

For the purposes of the description of the stepped substack contact structure, the stack of layers can be classified into a plurality of substacks, including for the two-step embodiment illustrated, three substacks SS(0), SS(1) and SS(2). Each of the substacks in this embodiment includes eight layers, four of which are active layers, and four of which are insulating layers. Thus, the first substack SS(0), includes layers 420.0 through 420.7. Likewise, the second substack SS(1), includes layers 421.0 through 421.7. The third substack SS(2), includes layers 422.0 through 422.7. In the layer numbering convention used in this illustration, the even numbered layers are active layers, and the odd numbered layers are insulating layers. At this stage in the manufacturing processes, all of the substacks overlie the lower surface 410 of the substrate, and overlie the rises (407.0, 407.1) and the runs of all of the steps.

As can be seen, the stacks are conformal with the steps, so that each of the layers in the stacks includes horizontal portions and vertical portions. The vertical portions of the layers are offset relative to the steps by the thicknesses of the stacks as formed on the sides of the structures.

Also, in some regions of the structure portions of the lowermost layers 420.0, 421.0 and 422.0 are all disposed at a common level aligned with the layer 420.0 overlying the run of the uppermost step. Also, portions of the uppermost layers 420.7, 421.7 and 422.7 are all disposed at a common level aligned with the layer 420.7 overlying a run of the uppermost step, in some regions of the structure.

Figure 11:
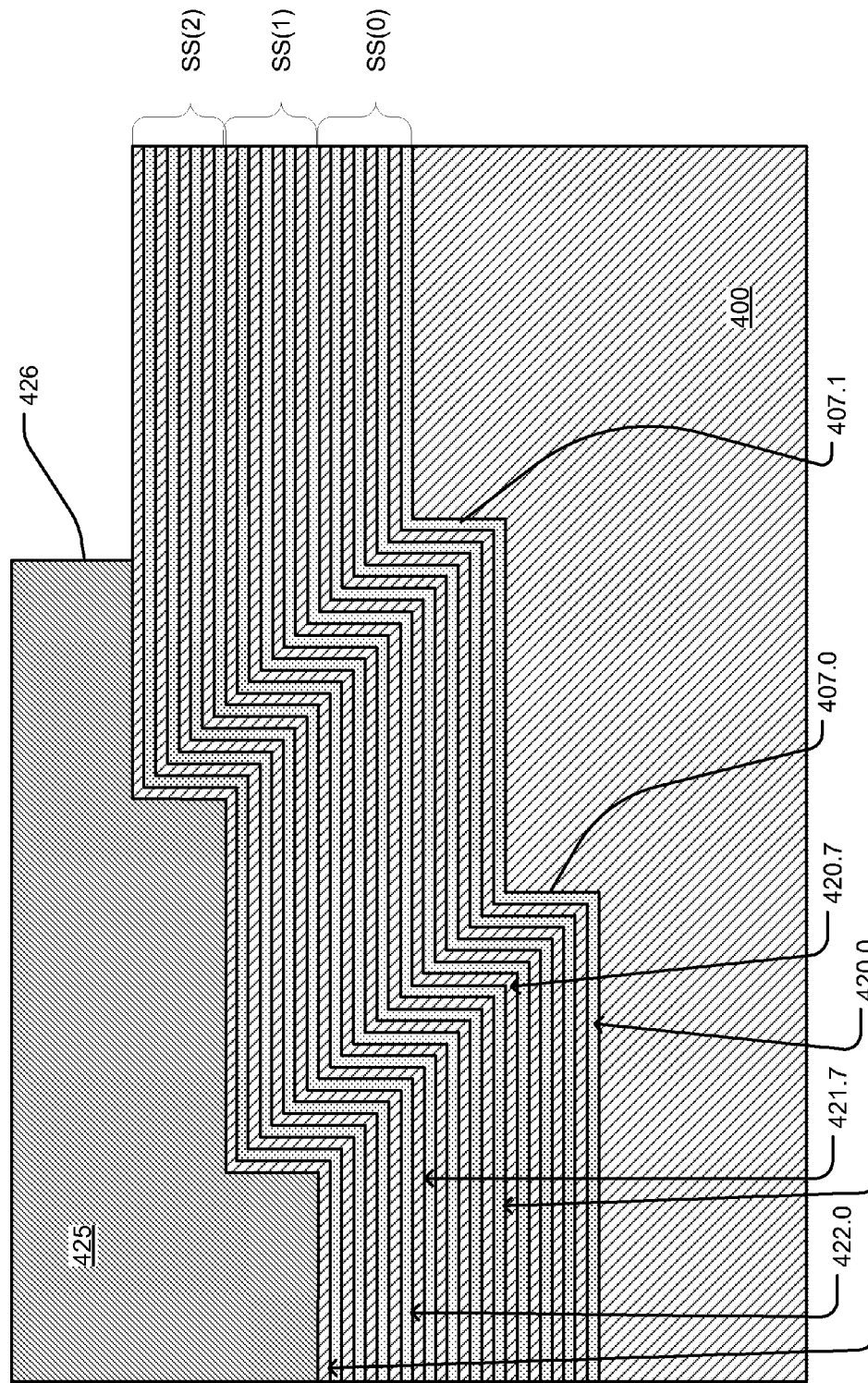

FIG. 11 illustrates an eighth stage in the manufacturing processes after formation of a mask layer 425 which can comprise photoresist, for example, defining a line 426. The line 426 defines a region over the run of the uppermost step, and over the plurality of stacks, in which the active layers of all the substacks are horizontal through a significant portion of the region.

Figure 12:
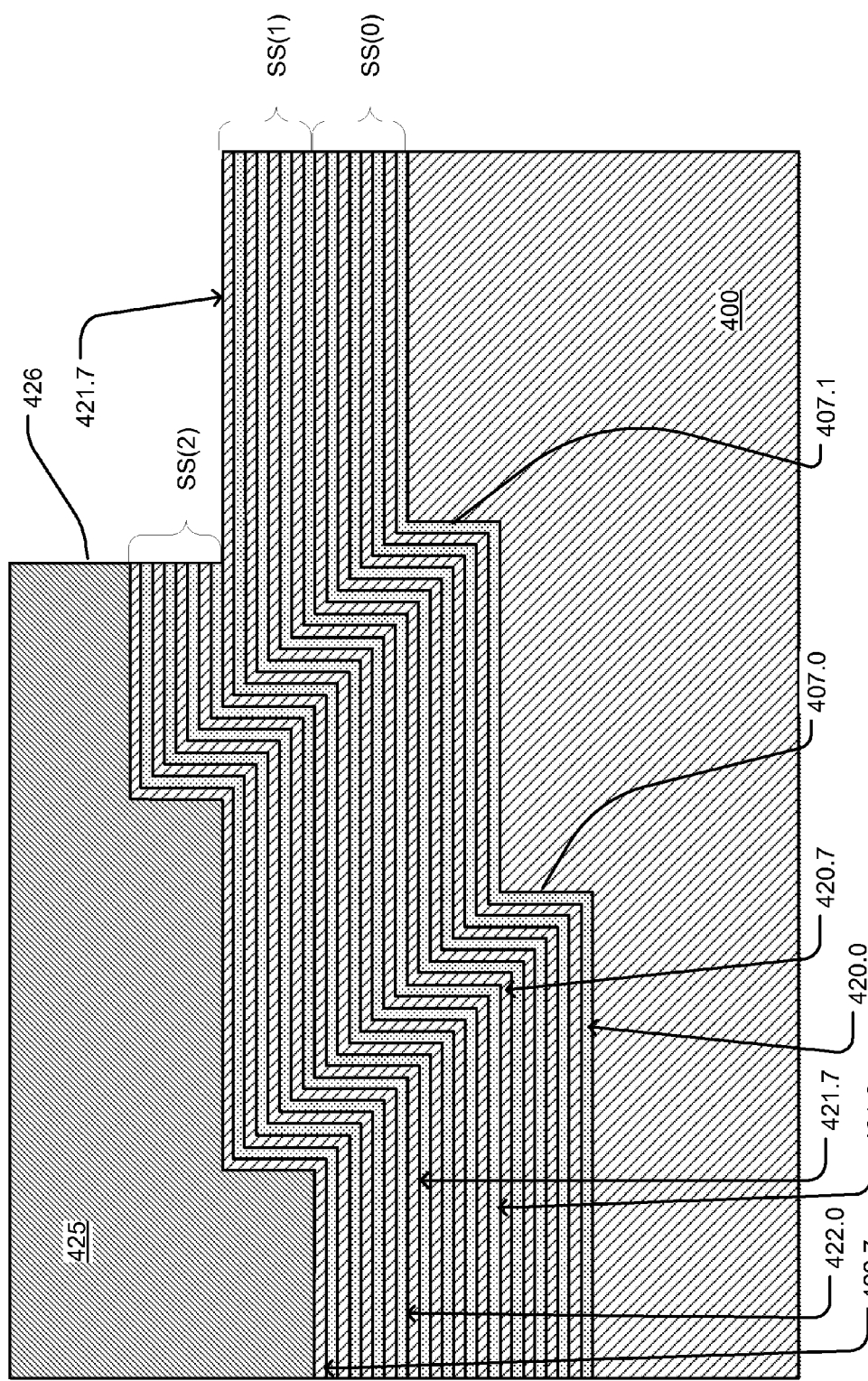

FIG. 12 illustrates the ninth stage in the manufacturing processes after executing an etch process to remove the uppermost substack SS(2) from the exposed region defined by the line 426. For a process in which all of the substacks have an equal number of layers, with four active layers, the etch process can be executed for example in four cycles, each stopping after removal of one active layer and one insulating layer. As a result of the etch process shown in FIG. 12, the uppermost layer 421.7 of the second substack SS(1) is exposed in the opened region.

Figure 13:
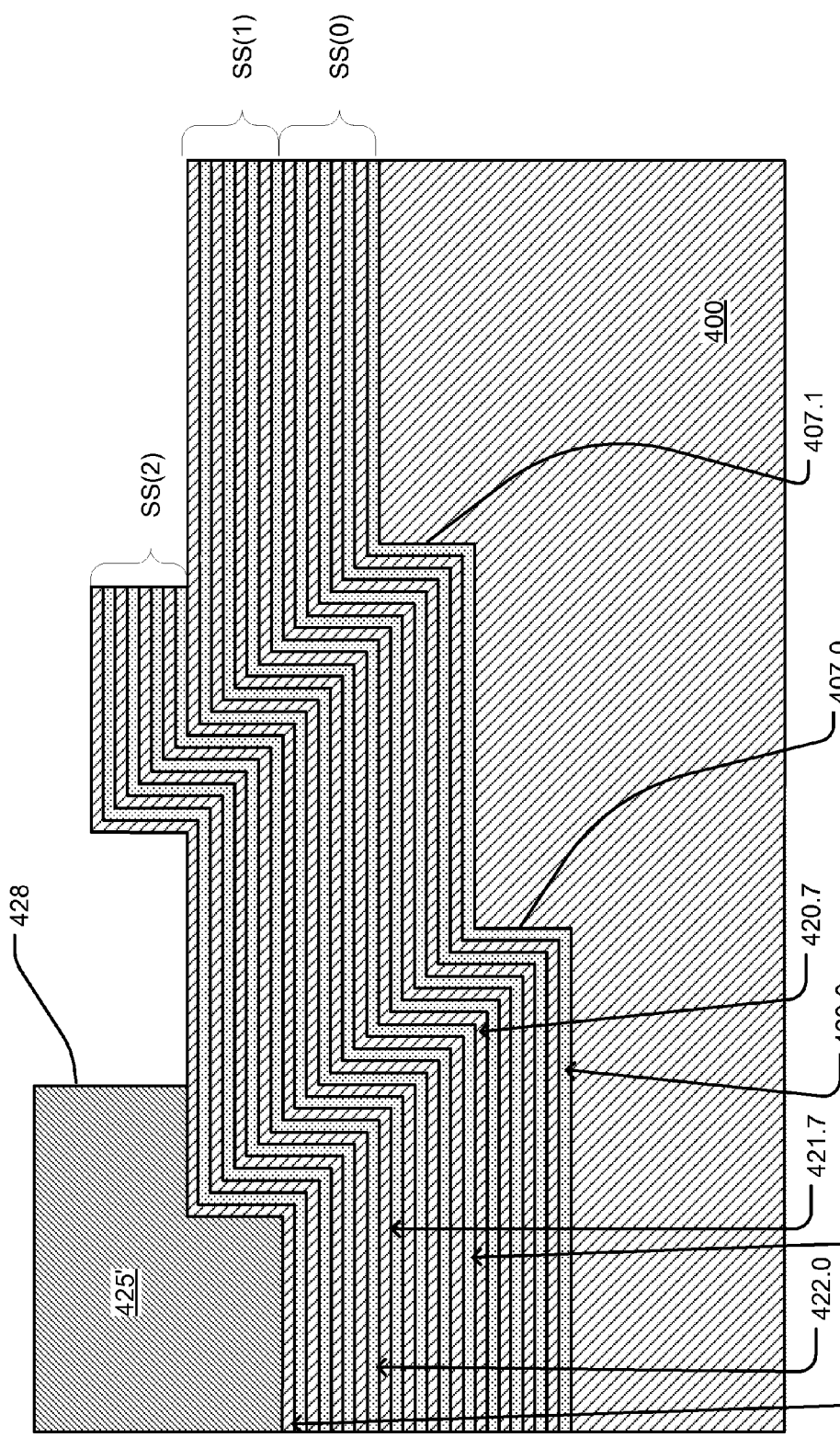

FIG. 13 illustrates a tenth stage in the manufacturing processes after executing a photoresist trim process leaving a portion 425' of the photoresist layer 425, defining a line 428. The line 428 defines a region over a run of the second step in this example, and over the plurality of stacks, and in which active layers of all the substacks are horizontal through a portion of the region.

Figure 14:
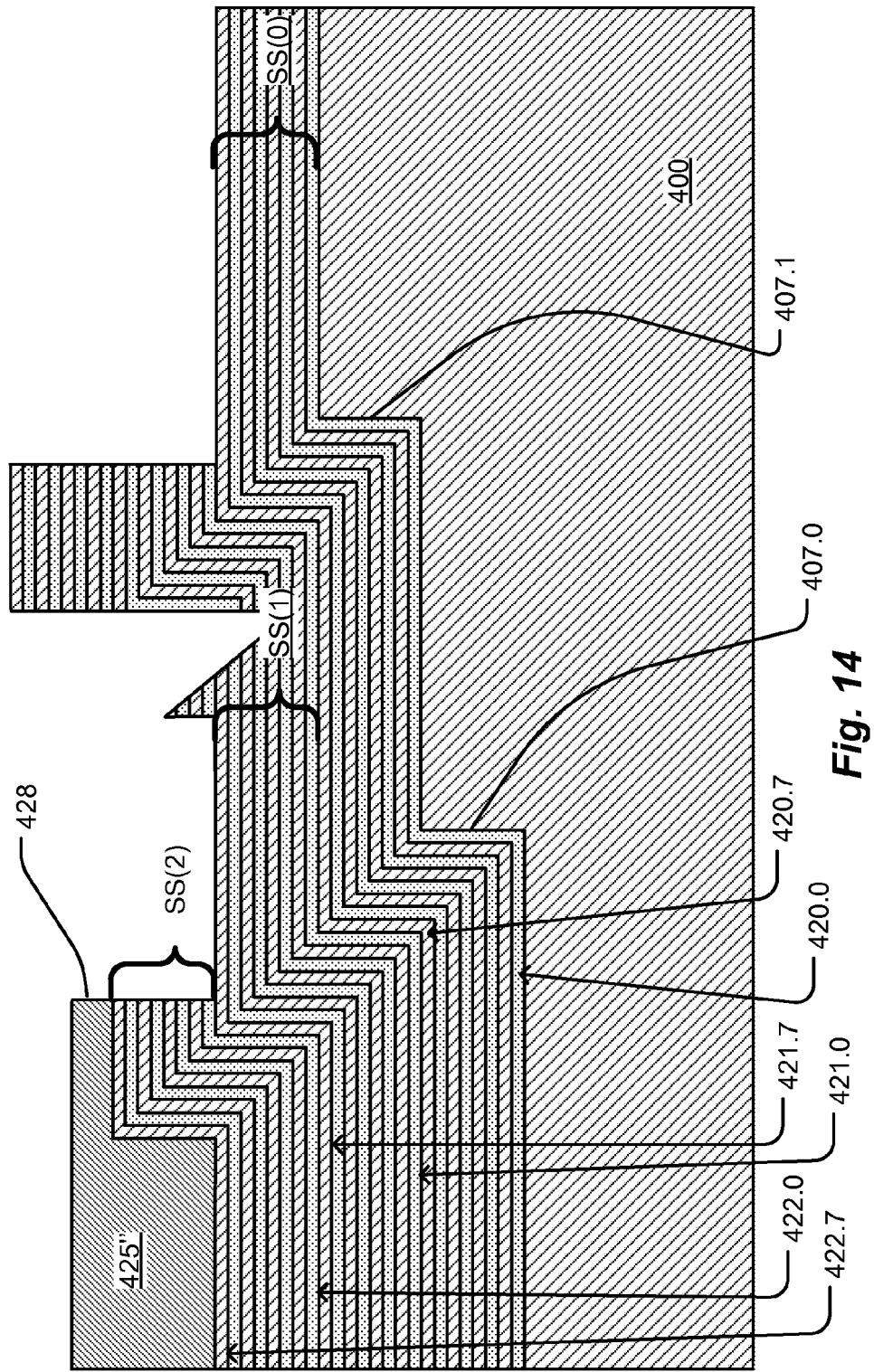

FIG. 14 illustrates an eleventh stage in the manufacturing processes after executing an etch process to remove the uppermost substack SS(2) in a region adjacent to the line 428, and the second substack SS(1) from the region overlying the run of the last step, leaving a portion 425" of the photoresist layer. This can be accomplished, for processes in which all the substacks have an equal number of layers, in a procedure in which each substack includes four active layers, by a four-cycle etch process, each cycle stopping after the removal of one active layer.

Figure 15:
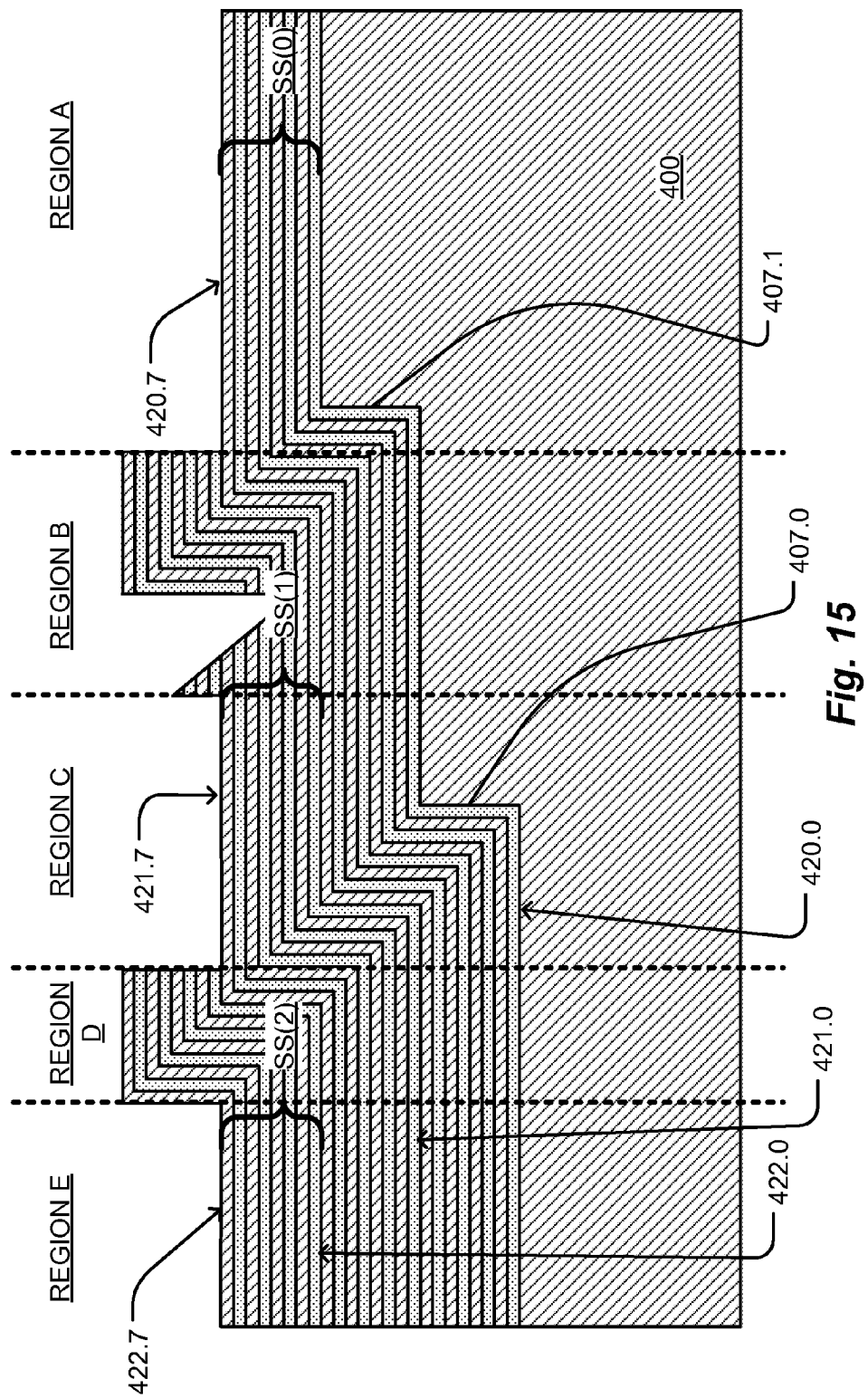

FIG. 15 illustrates a twelfth stage in the manufacturing processes after executing a photoresist strip step. The resulting structure can be classified in five regions, region A through region E. In region A, the uppermost layer 420.7 of the first substack SS(0) is exposed, and all of the layers of substack SS(0) are horizontal over a significant portion of the region.

In region B, all of the layers of the first substack SS(0) are continuous over the rise 407.1 of the uppermost step down over the run of the next step. Also, the layers in the second substack SS(1) which extend vertically as a result of the stepped structure, and in which some of the layers may have indeterminate shapes, result. Thus, region B can be considered a region of overhead in the layout.

In region C, the uppermost layer 421.7 of the second substack SS(1) is exposed, and all of the layers of the second substack SS(1) are horizontal over a significant portion of the region. As can be seen, because of the conformal nature of the deposition, the sides of region C are offset somewhat from the rise 407.0 of the first step.

Region D is an additional overhead region, through which layers of the first and second substacks SS(0) and SS(1) are continuous, while layers of the third substack SS(2) may have indeterminate shapes.

In region E, the uppermost layer 422.7 of the third substack SS(2) is exposed, and all the layers of the third substack SS(2) are horizontal over a significant portion of the region.

In the illustrated example, a photoresist trim-etch process is used so that only one photolithographic step is needed for the steps in FIGS. 11 to 15. In alternative approaches, which might be used for example in embodiments requiring a tighter design rule, a first mask can be used to define region A, followed by an eight-cycle etch in which the layers of the second and third substacks SS(1) and SS(2) are removed, followed by a second mask used to define the region C, followed by a four-cycle etch in which the layers of the third substack SS(2) are removed.

Figure 16:
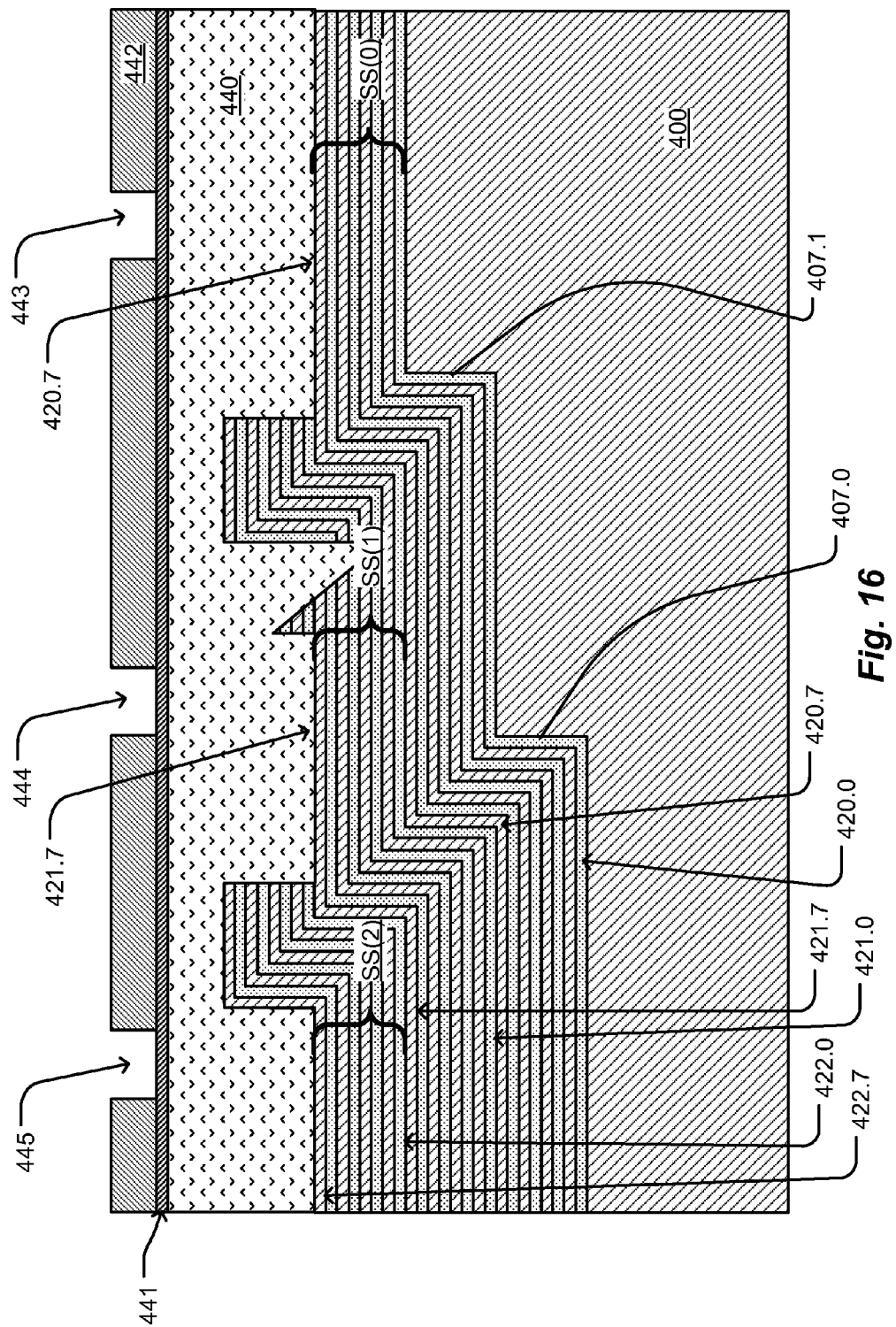

FIG. 16 illustrates a thirteenth stage in the manufacturing processes after formation of a layer 440 used to form a flat layer for lithographic patterning. In one example, the layer 440 can comprise an organic dielectric layer, ODL, deposited using a spin-on process. Depending on the thicknesses of the substacks, because in some ODL processes it is difficult to form a thickness more that than about 400 nanometers, multiple application processes may be needed to reach a desired thickness. After formation of layer 440, an additional layer 441 of hard mask material, such as a silicon rich bottom antireflective coating, known as ShHB, can be formed on the layer 440. This provides a flat surface for formation of a layer 442 of photoresist which can be patterned to define openings 443, 444, and 445, which overlie selected portions of the regions A, C and E as labeled in FIG. 15.

Figure 17:
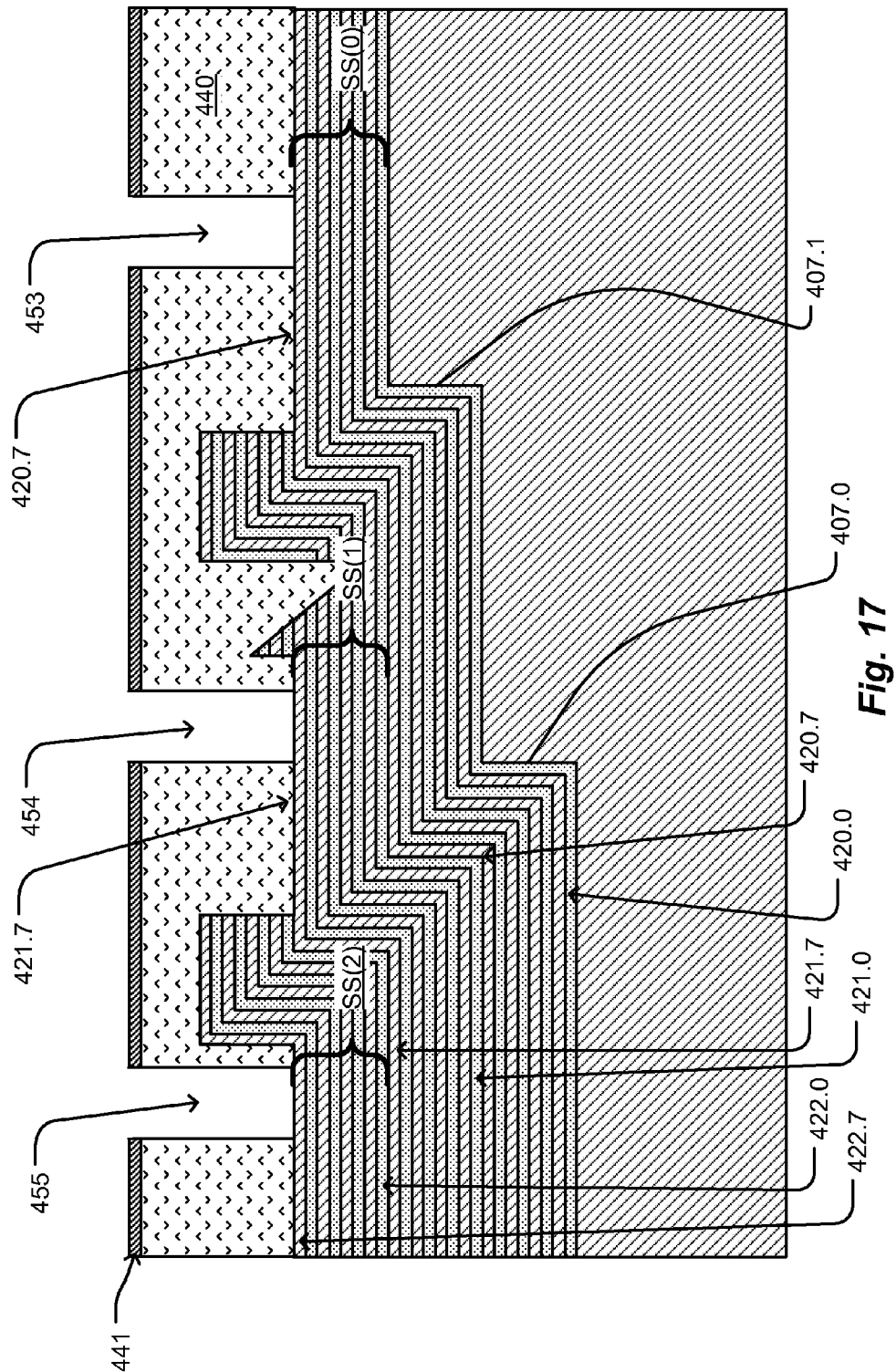

FIG. 17 illustrates a fourteenth stage, after etching to transfer of the pattern from the photoresist layer 442 into the planarizing layer 440 exposing the uppermost layer 422.7 of substack SS(2) in the opening 455, the uppermost layer 421.7 of substack SS (1) in the opening 454, and the uppermost layer 420.7 of substack SS(0) in the opening 453.

Figure 18:
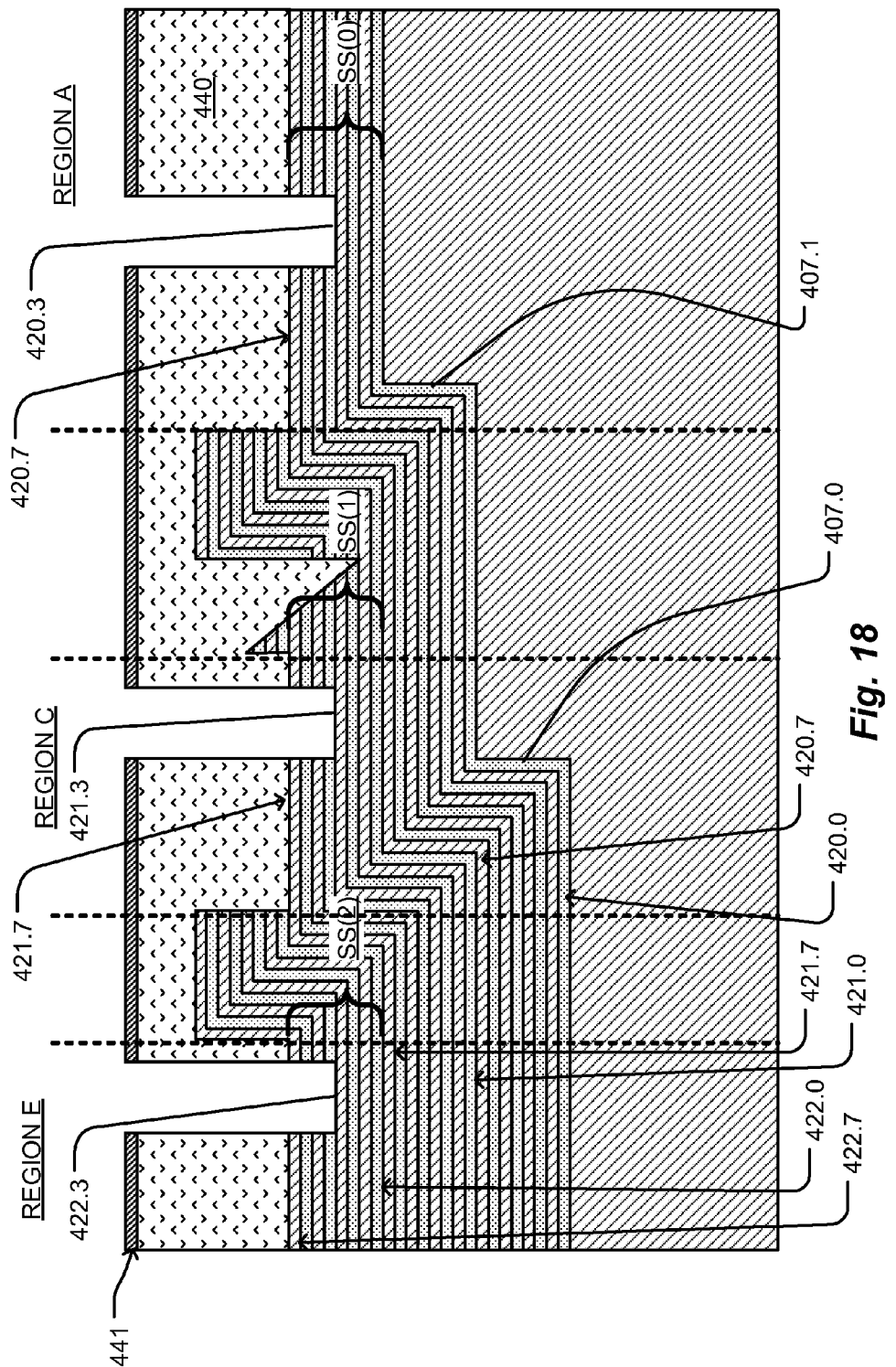

FIG. 18 illustrates a fifteenth stage in the manufacturing processes after executing a two-cycle etch process which removes two active layers in each of the openings. Thus, in this example, insulating layer 422.3 is exposed in the opening formed in region E, insulating layer 421.3 is exposed in the opening formed in region C and insulating layer 420.3 is exposed in the opening formed in region A.

Figure 19:
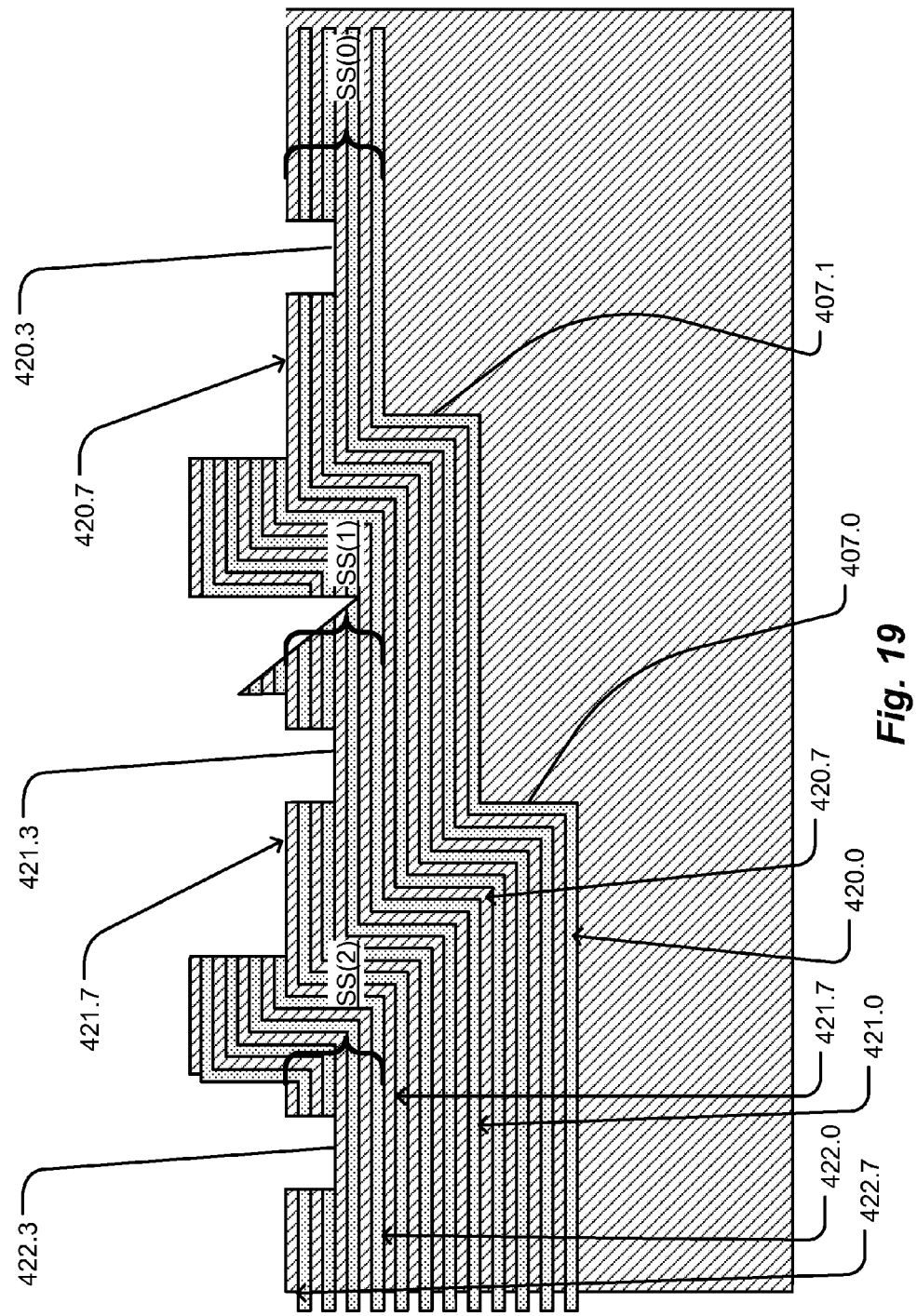

FIG. 19 illustrates the sixteenth stage after stripping the layers 440 and 441.

Figure 20:
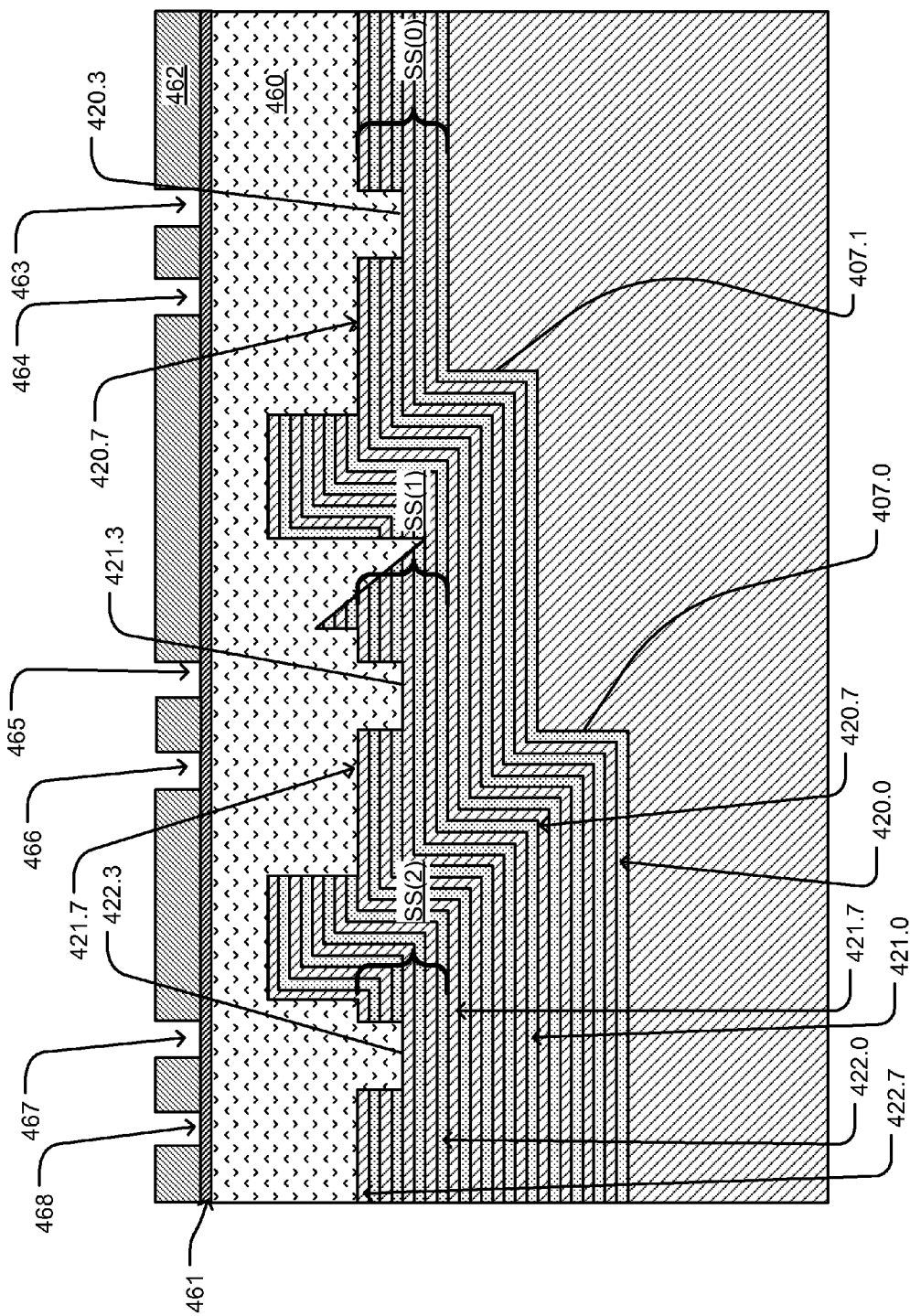

FIG. 20 illustrates the seventeenth stage in the manufacturing processes after formation of a layer 460 used to form a flat layer for lithographic patterning. In one example, the layer 460 can comprise an organic dielectric layer, ODL, deposited using a spin-on process. After formation of layer 460, an additional layer 461 of hard mask material, such as a silicon rich bottom antireflective coating, known as SHB, can be formed on the layer 460. This provides a flat surface for formation of a layer 462 of photoresist which can be patterned to define openings 463 through 468, which overlie selected portions of the regions A, C and E as labeled in FIG. 15. As can be seen, there are two openings overlying each of the regions. In region A, a first opening 463 overlies the area subjected to the etch of FIG. 18, where the opening 453 in the step shown in FIG. 17 was formed. Also, in region A, a second opening 464 is formed in the region that is outside the area of the opening 453. In the same manner, in region C, a first opening 465 overlies the area subjected to the etch of FIG. 18, where the opening 454 in the step shown in FIG. 17 was formed. Also, in region C, a second opening 466 is formed in the region that is outside the area of the opening 454. In region E, a first opening 467 overlies the area subjected to the etch of FIG. 18, where the opening 455 in the step shown in FIG. 17 was formed. Also, in region E, a second opening 468 is formed in the region that is outside the area of the opening 455.

Figure 21:
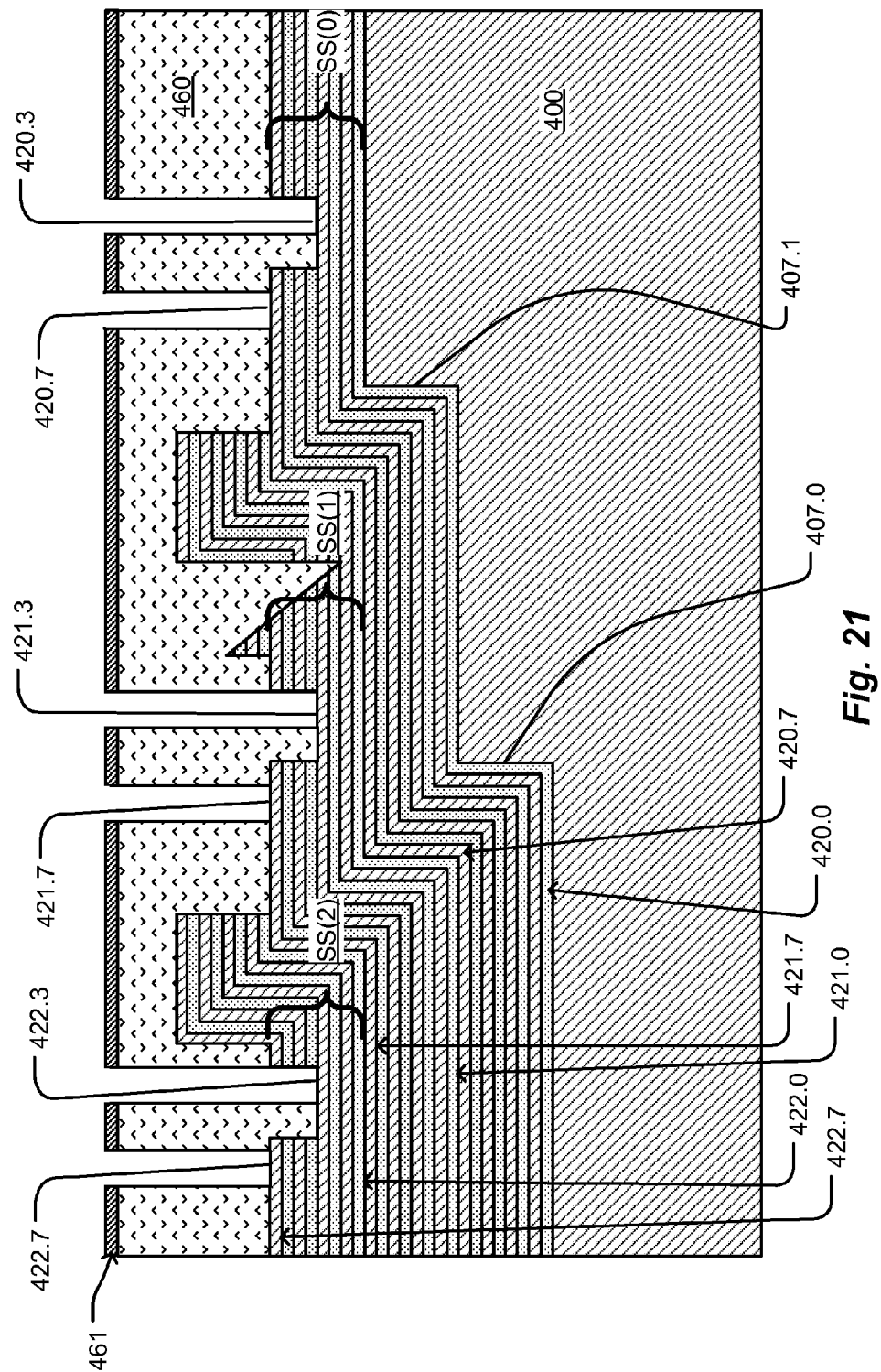

FIG. 21 illustrates an eighteenth stage in the manufacturing processes, after the pattern of the photoresist layer 462 is transferred into the layers 461 and 460, exposing corresponding parts of the plurality of substacks.

Figure 22:
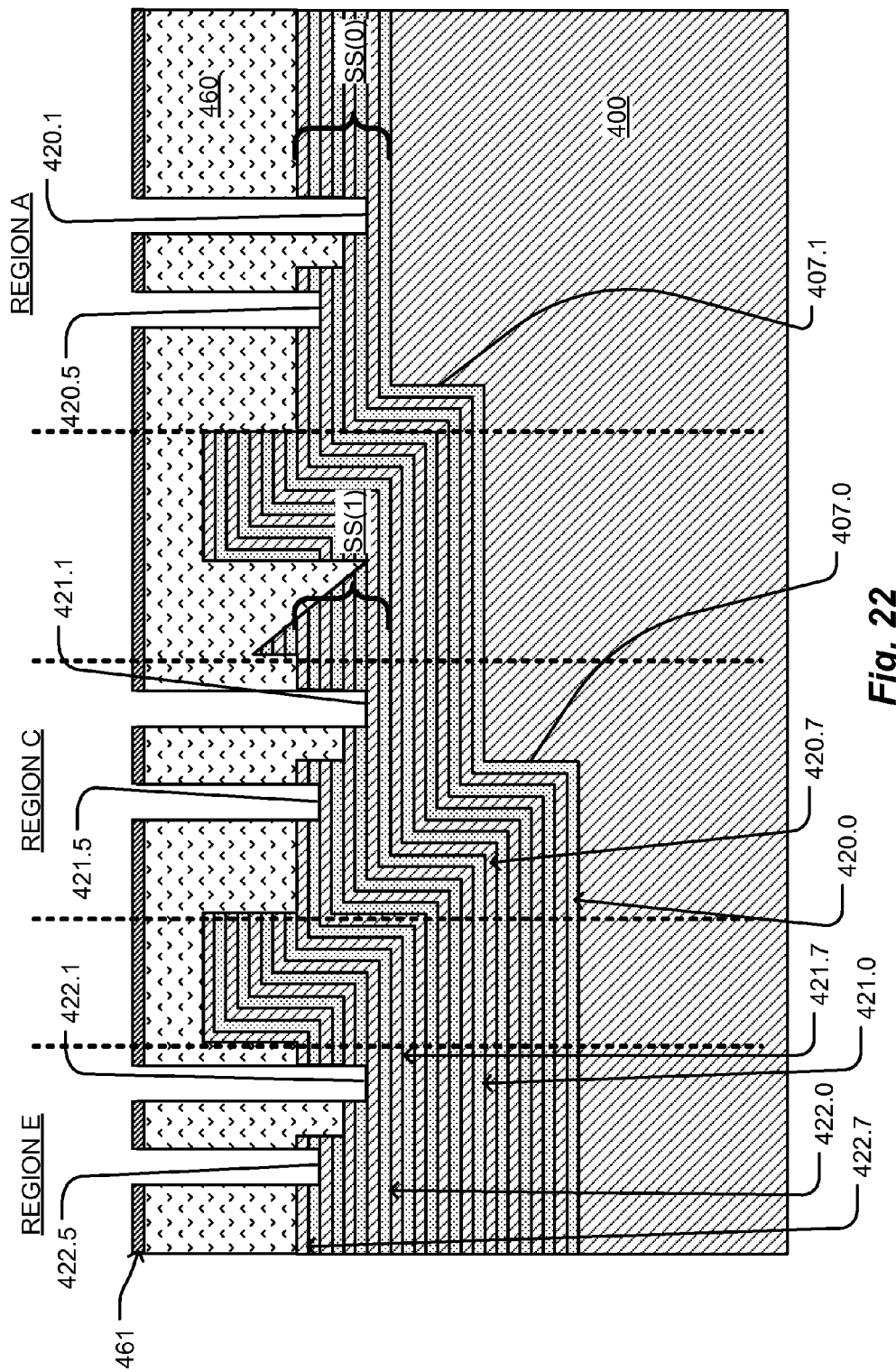

FIG. 22 illustrates the nineteenth stage in the manufacturing processes, after an etch cycle is executed to remove one active layer in each opening. Thus, in this example in region A, the insulating layer 420.1, and the insulating layer 420.5 are exposed in the two openings. In region C, the insulating layer 421.1 and the insulating layer 421.5 are exposed in the two openings. In region E, the insulating layer 422.1 and the insulating layer 422.5 are exposed in the two regions.

Figure 23:
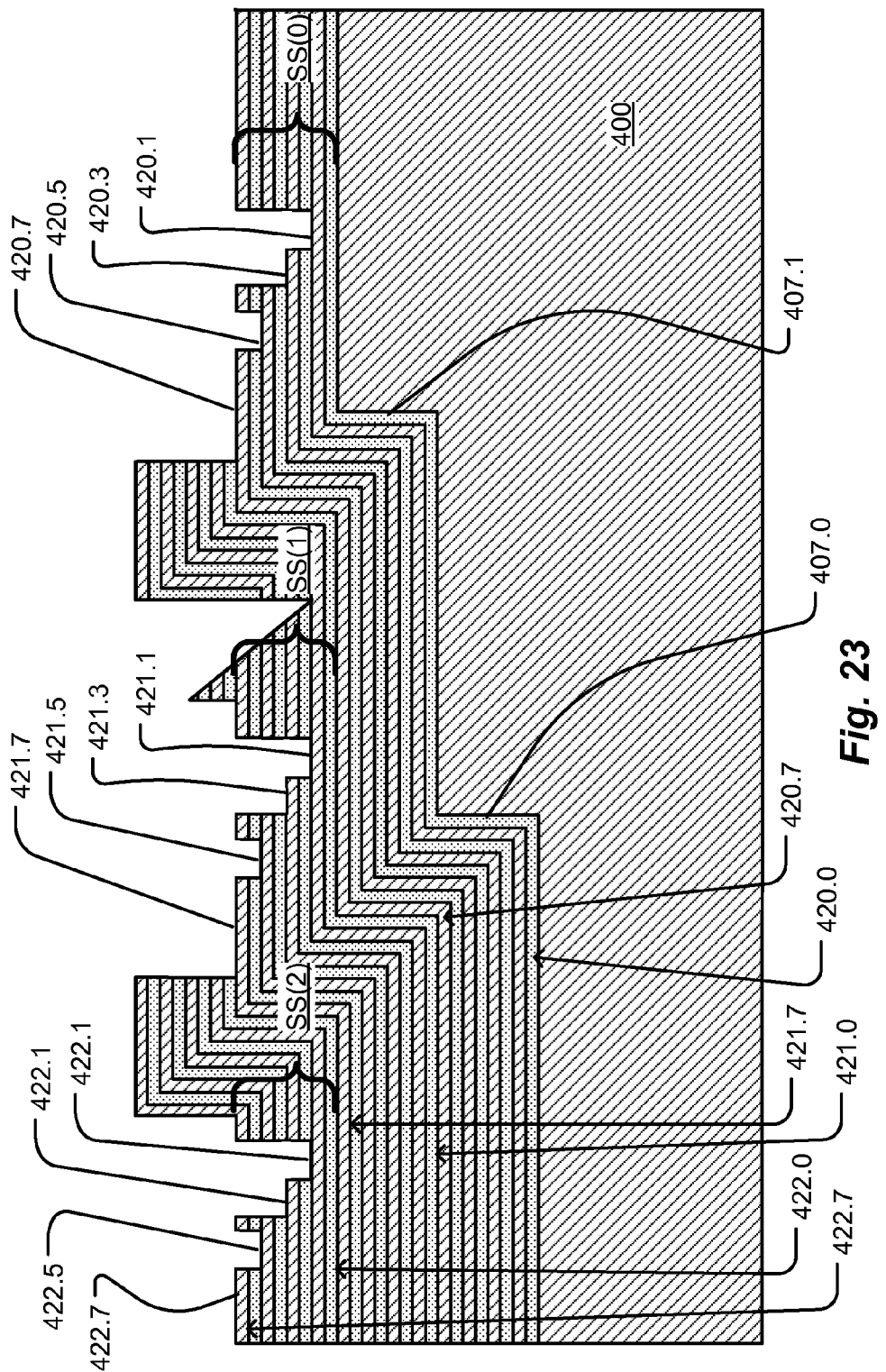

FIG. 23 illustrates the twentieth stage in the manufacturing processes, after removing layers 460 and 461. This structure results from the binary sum etching cycle shown in FIGS. 16 through 22 forming vias to $2^N$ (N=2) different levels using N (two) etch steps. Of course, other etch procedures could be followed to achieve similar results, including ternary and quaternary sum processes. As a result of the etching processes, in region A, openings expose layers 420.1, 420.3, 420.5 and 420.7 in the first substack SS(0). In region C, openings expose layers 421.1, 421.3, 421.5 and 421.7 in the second substack SS(1). In region E, openings expose layers 422.1, 422.3, 422.5 and 422.7 in the third substack SS(2).

Figure 24:
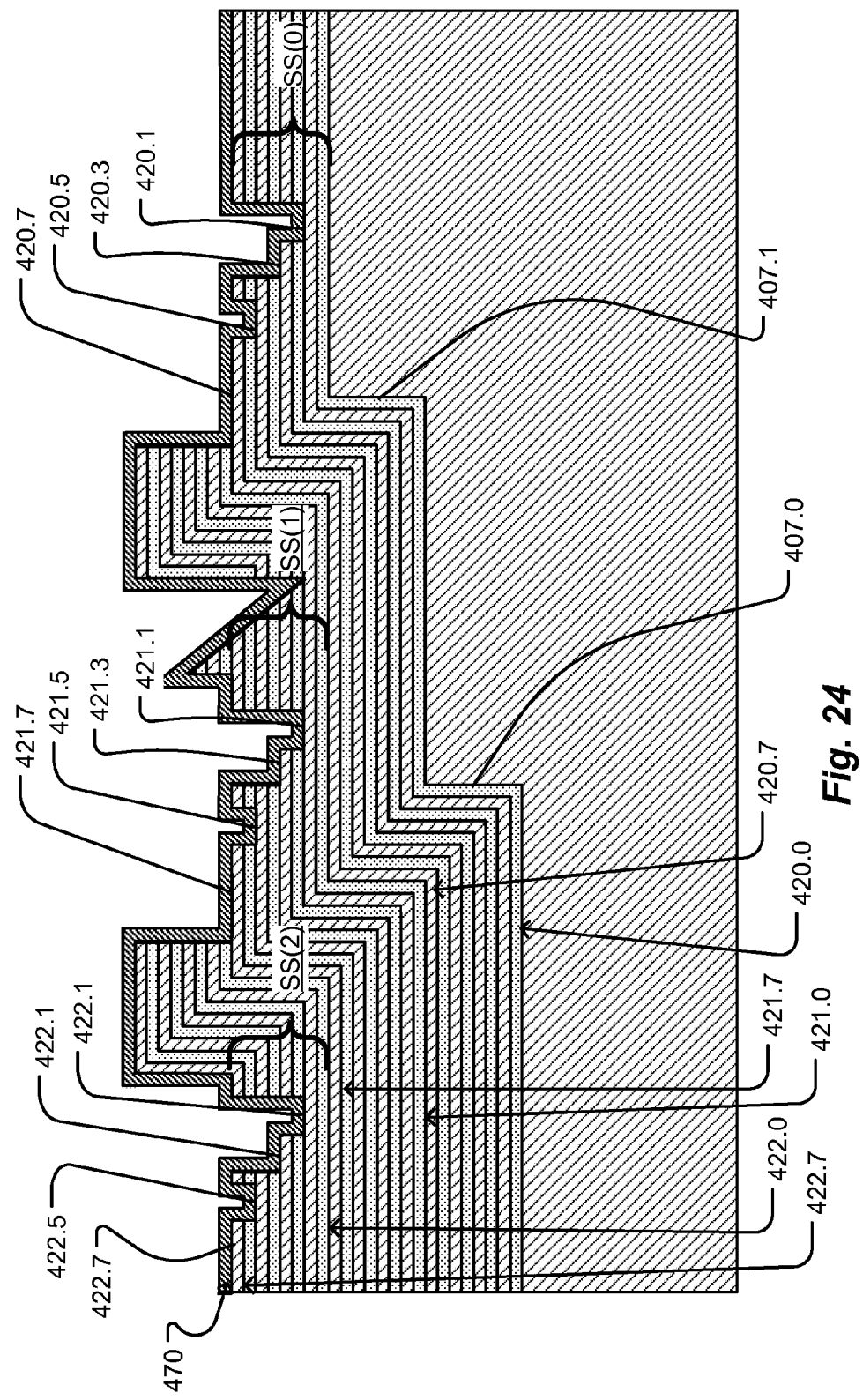

FIG. 24 illustrates a twenty-first stage in these example manufacturing processes, after formation of an etch stop layer 470 comprising silicon nitride in this example which conformally lines the openings in the surface of the structure.

Figure 25:
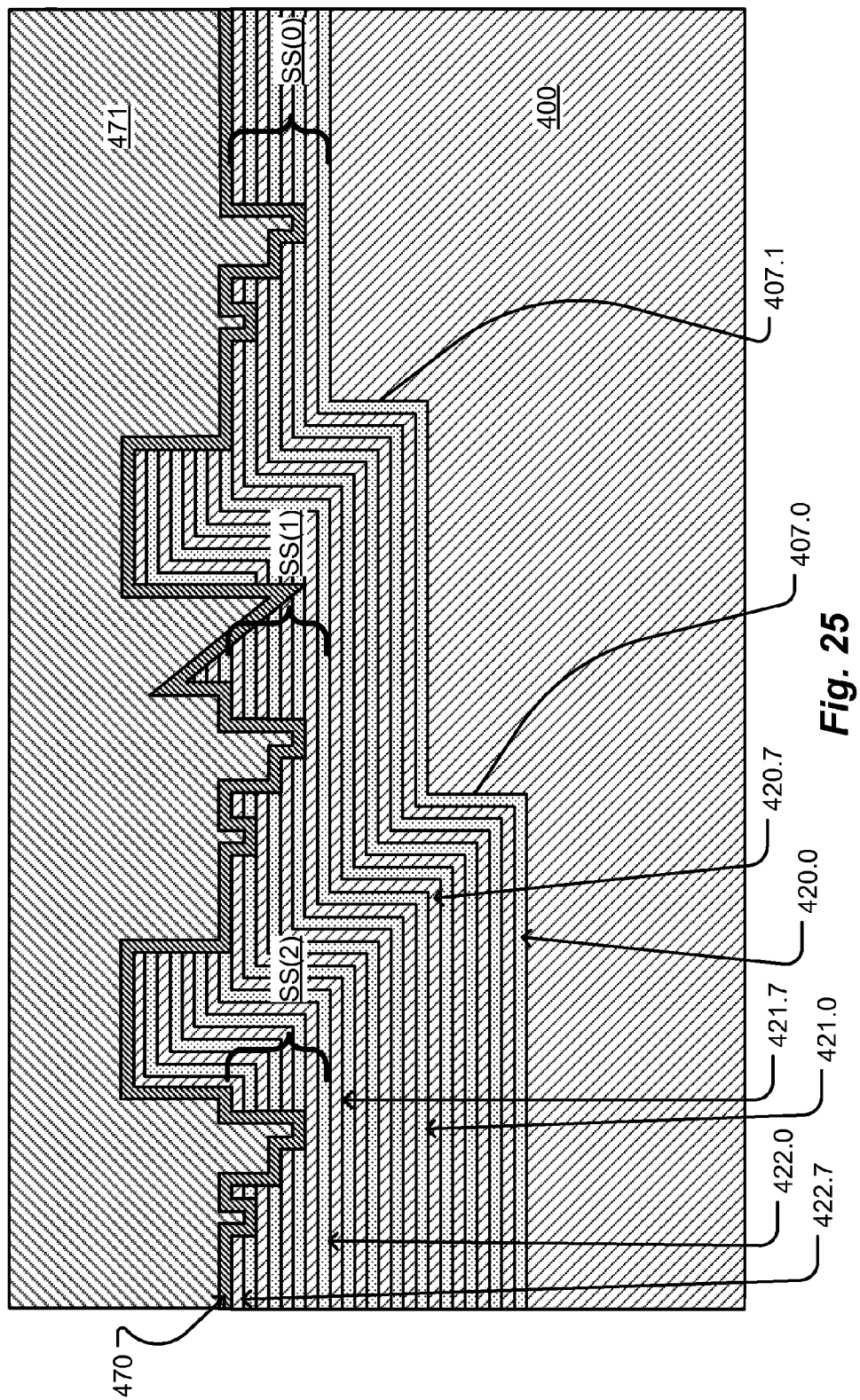

FIG. 25 illustrates a twenty-second stage in these example processes, after formation of a dielectric fill, planarizing layer, such as a silicon dioxide layer 471 over the etch stop layer 470.

Figure 26:
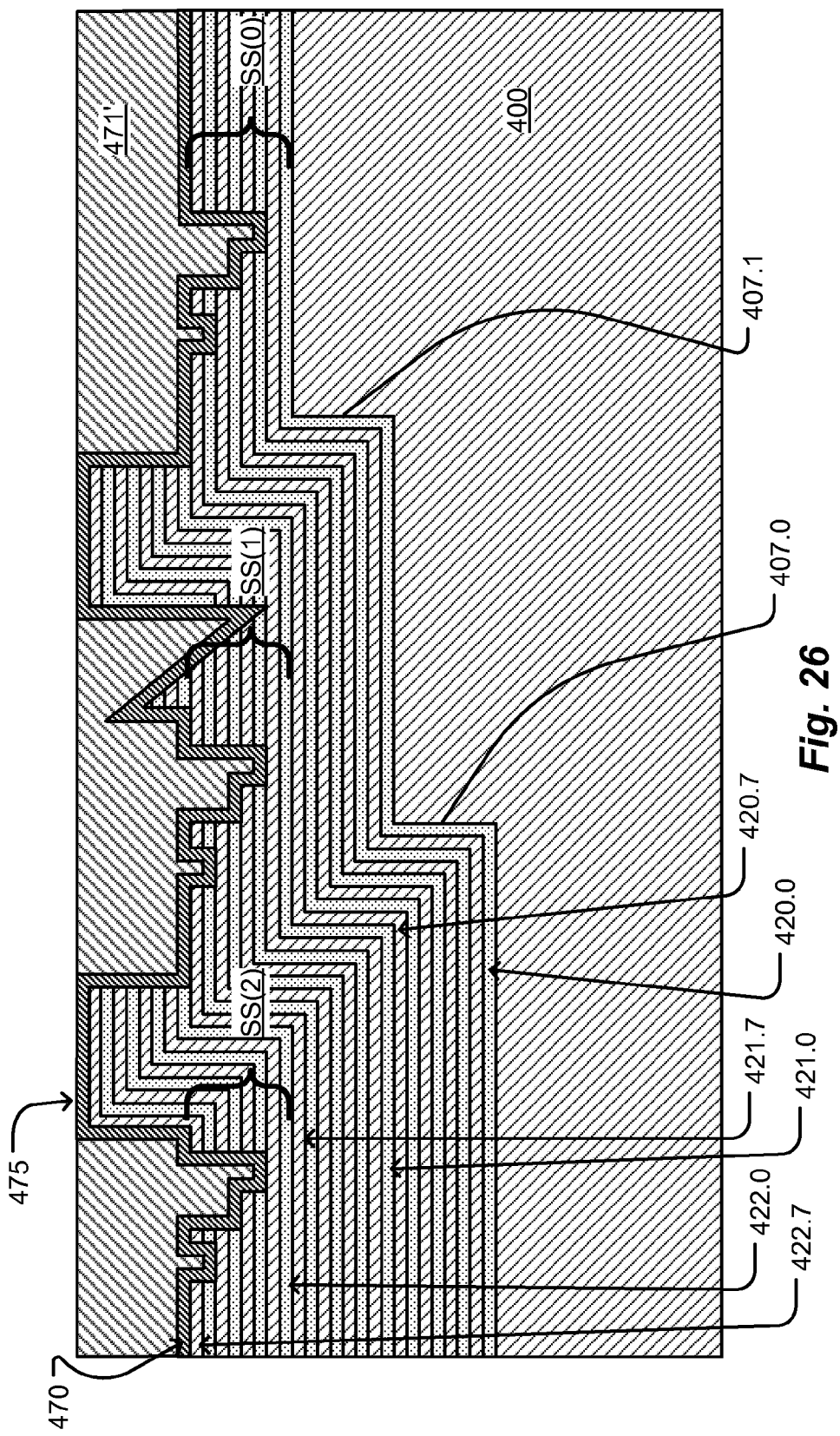

FIG. 26 illustrates the twenty-third stage in the manufacturing processes, after performing a planarizing process which stops on the etch stop layer 470 in the overhead region 475. As a result of this step, the depth of the interlayer connectors to be formed can be reduced by reducing the thickness of the oxide layer 471'.

Figure 27:
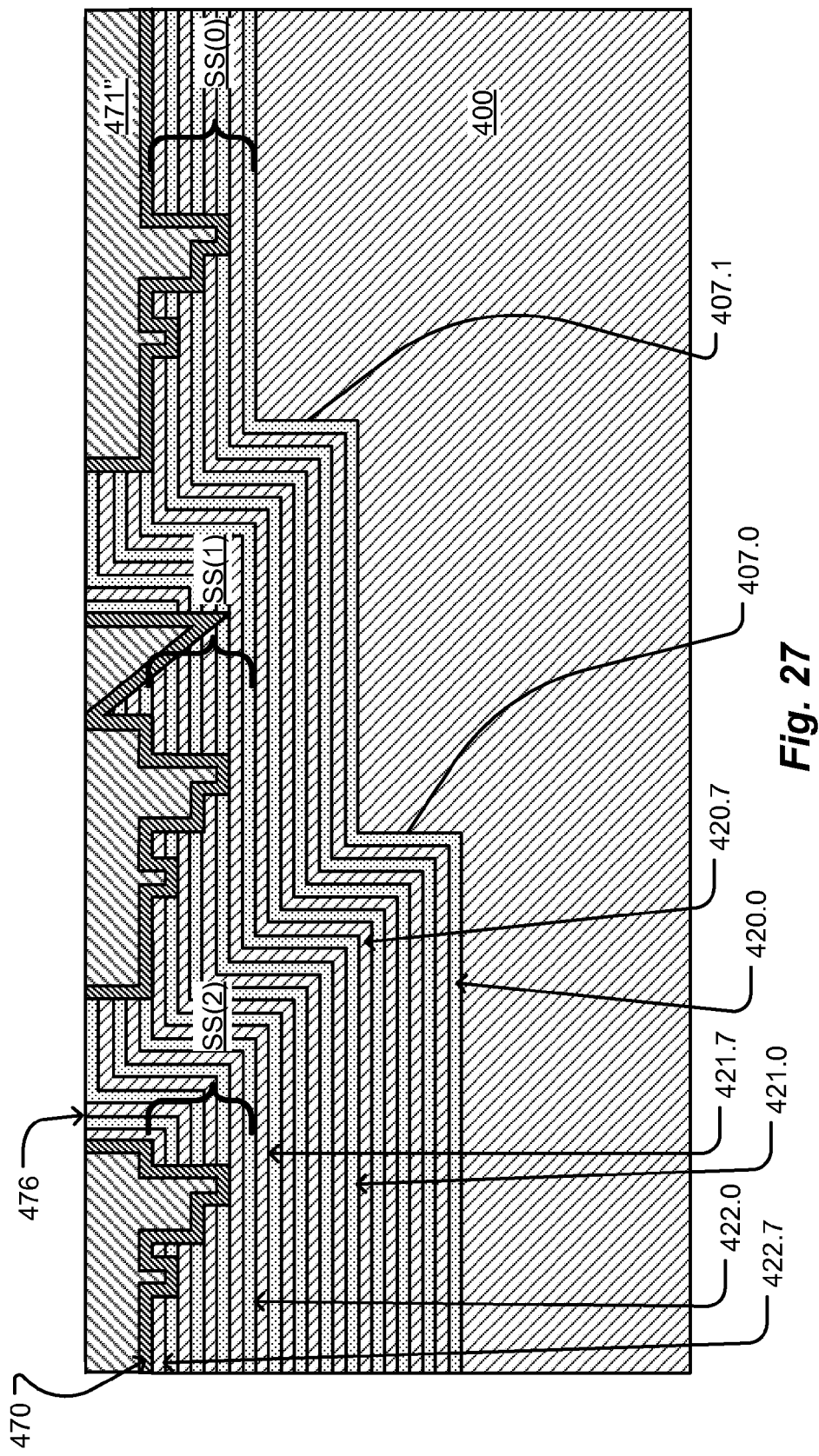

FIG. 27 illustrates an alternative twenty-third stage in the manufacturing processes after performing a planarizing process which proceeds to a level 476 below the top surface (475 in FIG. 26) of the etch stop layer 470 to further reduce the required length of the interlayer connectors by reducing the thickness of the oxide layer 471".

Figure 28:
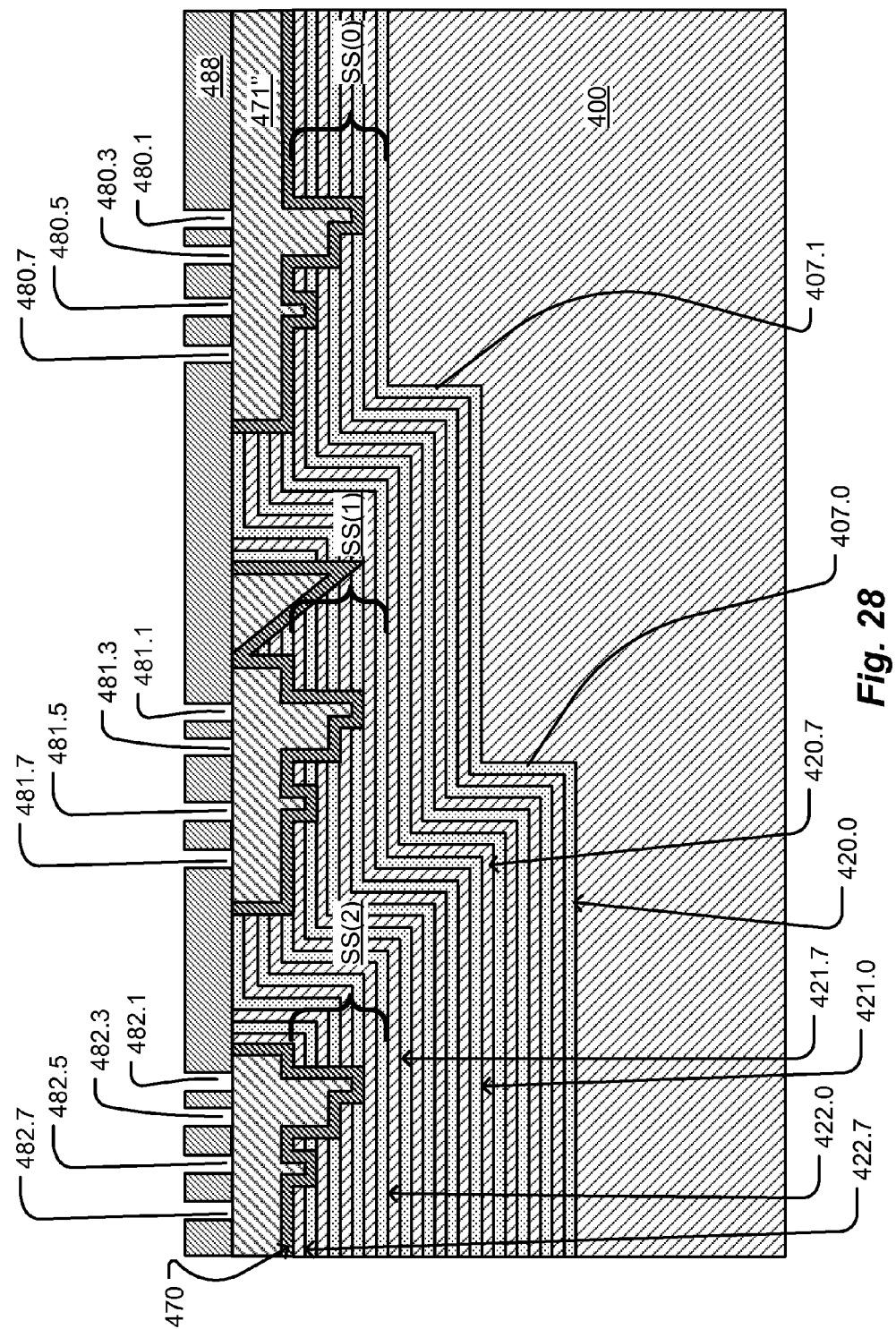

FIG. 28 illustrates a twenty-fourth stage in the manufacturing processes, after formation of a patterned photoresist layer 488. In this layer 488, contact openings 480.1, 480.3, 480.5 and 480.7 are formed in region A, contact openings 481.1, 481.3, 481.5 and 481.7 are formed in region C, and 482.1, 482.3, 482.5 and 482.7 are formed in region E.

Figure 29:
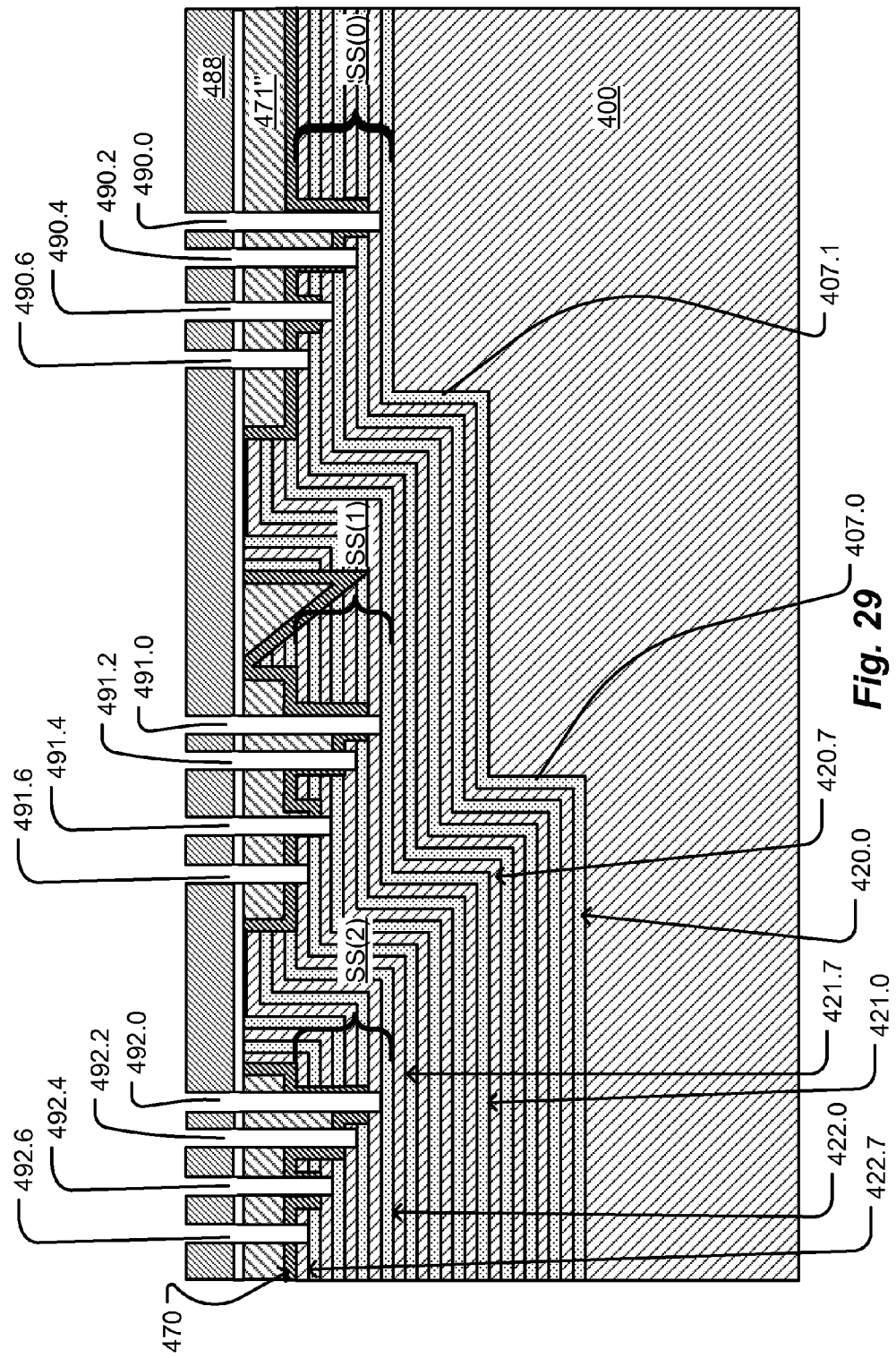

FIG. 29 illustrates the twenty-fifth stage in the manufacturing processes, after a contact etch is executed using the mask shown in FIG. 28. The contact etch can etch through the overlying oxide layer 471' (or 471"), to the etch stop layer, and then through the etch stop layer to a corresponding active layer in the substacks. In region A, contact vias 490.0, 490.2, 490.4 and 490.6 are opened to the active layers 420.0, 420.2, 420.4 and 420.6, respectively. In region C, contact vias 491.0, 491.2, 491.4 and 491.6 are opened to the active layers 421.0, 421.2, 421.4 and 421.6, respectively. In region E, contact vias 492.0, 492.2, 492.4 and 492.6 are opened to the active layers 422.0, 422.2, 422.4 and 422.6, respectively.

Figure 30:
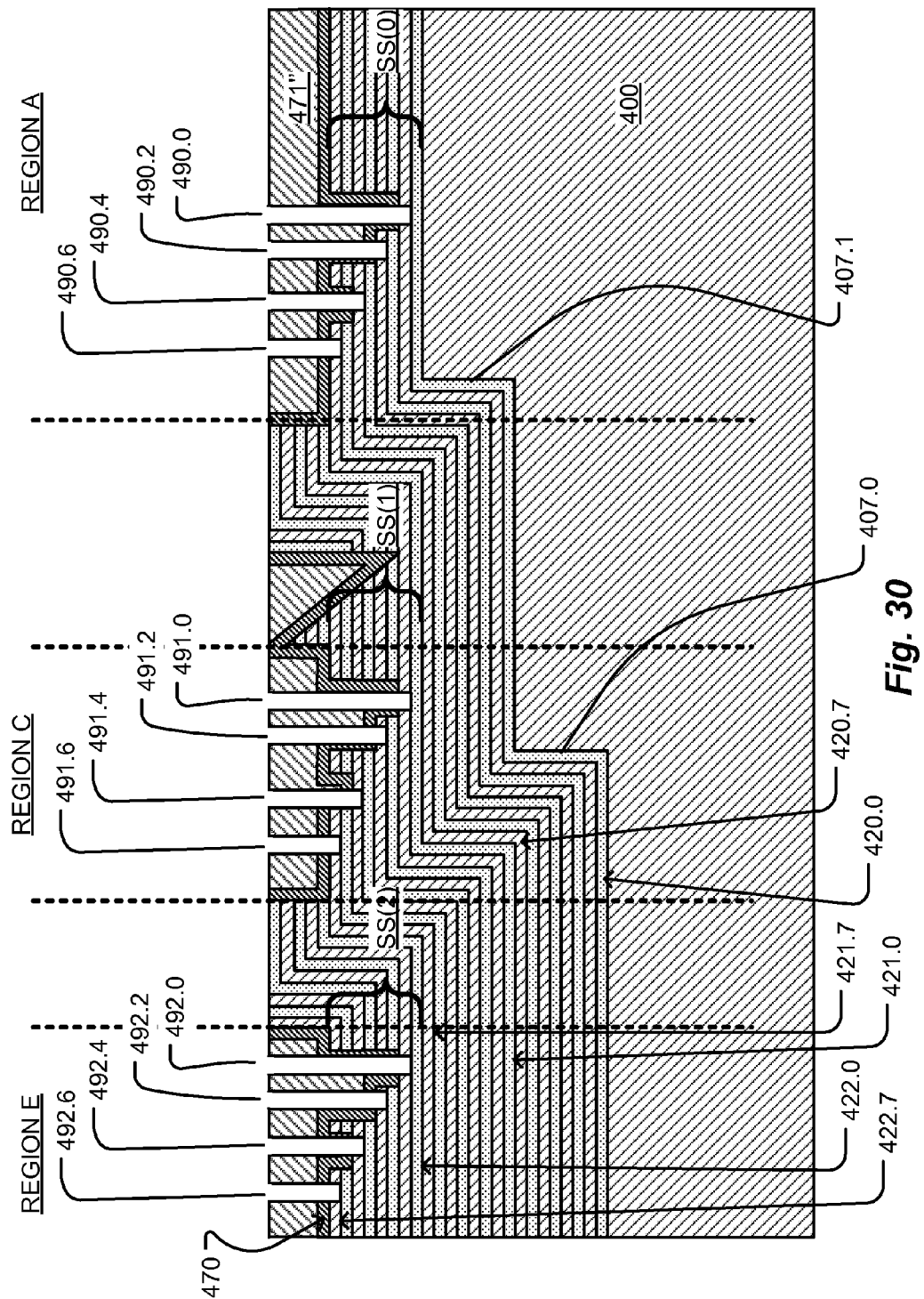

FIG. 30 illustrates a twenty-sixth stage in the manufacturing processes, after stripping of the photoresist layer.

Figure 31:
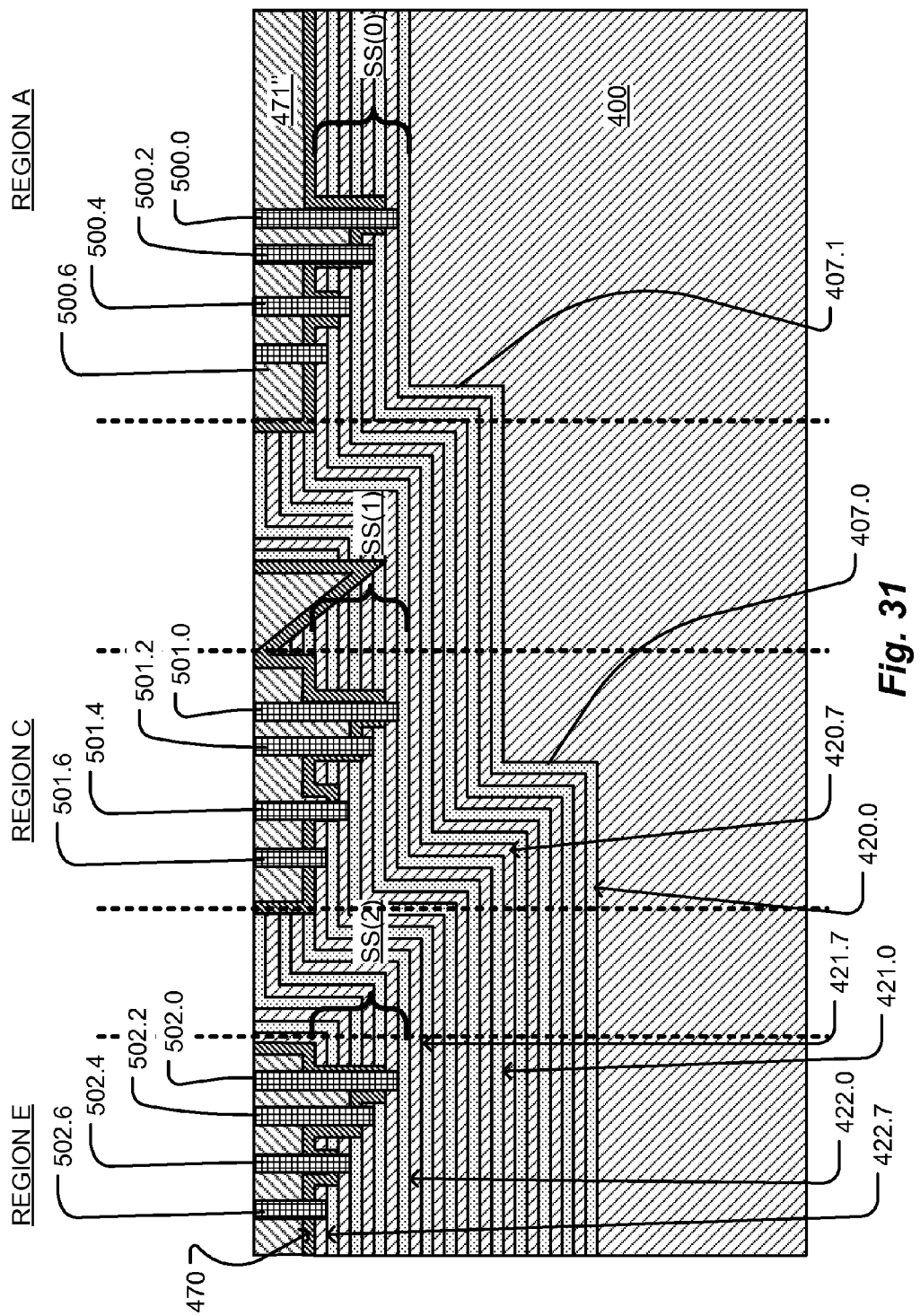

FIG. 31 illustrates a twenty-seventh stage in the manufacturing processes, after filling the contact vias with conductors that provide interlayer connectors. The conductors can comprise tungsten for example formed using a titanium and titanium nitride liner followed by a tungsten deposition. Alternatively other conductive materials can be utilized.

In region A, interlayer connectors 500.0, 500.2, 500.4 and 500.6 provide for connection to the active layers 420.0, 420.2, 420.4 and 420.6, respectively, in the substack SS(0). In region C, interlayer connectors 501.0, 501.2, 501.4, 501.6 provide for connection to the active layers 422.0, 421.2, 421.4 and 421.6, respectively, in the substack SS(1). In region E, interlayer connectors 502.0, 502.2, 502.4 and 502.6 provide for connection to the active layers 422.0, 422.2, 422.4 and 422.6, respectively, in the substack SS(2).

Referring to FIG. 31, the structure provides for interlayer connection to a stack of twelve active layers separated by insulating layers using interlayer contacts having the maximum depth needed to make contact to four layers. Thus, the maximum contact depth for the interlayer connectors is less than the depth of the layers being contacted.

Referring to just the first and second substacks SS(0) and SS(1), the structure includes a stack of active layers alternating with insulating layers on the substrate. The first and second substacks have respective uppermost layers 420.7 and 421.7. The first substack SS(0) overlies the rise 407.1 and the run of the last step. The run of the last step is on the surface 401 of the substrate. Region A is a first region over the first substack, and region C is a second region over the second substack in which the first and second substacks are disposed at a common level. Thus, in examples where the substacks have the same number and same thicknesses of layers, the uppermost layers 420.7 and 421.7 are configured to be coplanar; likewise, the lowermost layers 420.0 and 421.0 are configured to be coplanar.

For a substack to be considered to be disposed in a common level with another substack, all of the layers of the substacks must be disposed in levels between the lowermost layer and the uppermost layer of the thickest substack, inclusive.

In this example, in which the first and second substacks have respective thicknesses, the combination of the rise 407.1 of the step and the thickness of the first substack SS(0) matches the combination of the thicknesses of the first substack SS(0) and the second substack SS(1). In this example, the thicknesses of the first substack SS(0) and the second substack SS(1) match, and the rise 470.1 of the step is the same as that thickness.

Furthermore, using a binary sum etch process, where each substack has M layers, where M is between $(1+2^{K-1})$ and $2^K$, and said forming vias includes most K etching steps, whereby vias to landing areas on 2 times M active layers are formed in the at most K etch steps.

A binary sum etch process can also be used when at least one of the first and second substacks has M layers, and M is between $(1+2^{K-1})$ and $2^K$, the other of the first and second substacks has M or fewer layers. In this case, the patterned stairstep etch process includes at most K etching steps.

The illustrated process involves forming an insulating layer on the substrate, and forming a stepped structure in the insulating layer. In some examples, the stepped substack structure can be formed within a pit in the substrate as mentioned above.

The stepped substack interlayer connector structure can be described using an indexing notation to generalize it beyond one step and two substacks. Thus, for example, the manufacturing processes can include forming N steps, including step (i), for i=0 to N−1, from a surface of a substrate at a first level to a surface of the substrate at a second level, each step having a rise and a run, wherein the run of a last step (i=N−1) in the N steps is at the second level. Next, the process can include forming a stack of active layers alternating with insulating layers on the substrate, the stack including a N+1 substacks, including substacks (j), for j equal to 0 to N, and having respective uppermost layers, and lowermost layers. A first substack (j), j equal to 0, overlies the rises and runs of the N steps including the last step (i), i equal to N−1. The intermediate substacks (j) for j equal to 1 to N−1 overlie the preceding substacks and overlie the rises of the steps (i), for i equal to N−1−j. An uppermost substack overlies the preceding substacks and no step in the N steps. This arrangement forms respective regions over the substacks in which uppermost layers of the substacks are disposed at a common level. Then the process involves forming vias in the respective regions to landing areas on active layers in each of the plurality of substacks, and forming conductors in the vias.

Using the index notation, where substacks have respective thicknesses, in one example, the combination of the rise of the step (N−1−i), for j equal to 0 to N−1, with the thickness of substack (j), for j equal to i, matches the combination of the thicknesses of the substack (j) and substack (j+1). In another example, the N+1 substacks have matching thicknesses, the rises of the steps match the thicknesses of the substacks.

While the example integrated circuit used in the description above is a 3D NAND memory device, the interlayer connector technology described herein can be applied to other types of integrated circuits including other memory technologies, and other types of devices. For example, the structure can be utilized in formation of multilayer capacitor structures. The structure can also be utilized in the formation of multilayer logic.

While the present invention is disclosed by reference to the preferred embodiments and examples detailed above, it is to be understood that these examples are intended in an illustrative rather than in a limiting sense. It is contemplated that modifications and combinations will readily occur to those skilled in the art, which modifications and combinations will be within the spirit of the invention and the scope of the following claims.

What is claimed is:

1. A structure on a multilayer device, comprising:
    a substrate;
    N step(s) on the substrate from a surface of the substrate at a first level to a surface of the substrate at a second level, where N is an integer one or greater;
    a stack of active layers alternating with insulating layers on the substrate, including a plurality of substacks disposed in relation to the N step(s) to form respective contact regions in which the substacks are disposed at a common level, each substack having an upper layer;
    a nonconductive, silicon nitride etch stop layer covering the upper layer of each of the plurality of substacks; and
    conductors in the respective regions connected to landing areas on active layers in each of the plurality of substacks, the conductors passing through and physically contacting the nonconductive, silicon nitride etch stop layer.

2. The structure of claim 1, wherein N equals 1, the step having a rise and a run, wherein the run of the step is at the second level, the stack including first and second substacks having respective uppermost layers, the first substack overlying the rise and run of the step, and the second substack overlying the first substack and the surface at the first level to form a first region over the first substack and a second region over the second substack in which first and second substacks are disposed at a common level; and
    the conductors comprise interlayer connectors in the first and second regions extending to landing areas on active layers in each of the first and second substacks.

3. The structure of claim 2, wherein first and second substacks have respective thicknesses, and the combination of the rise of the step with the thickness of the first substack, matches the combination of the thicknesses of the first substack and second substack.

4. The structure of claim 2, wherein first and second substacks have matching thicknesses, and the rise of the step matches the thicknesses of the substacks.

5. The structure of claim 2, wherein the conductors to the lowermost active layers in the first and second substacks have matching lengths.

6. The structure of claim 2, wherein the conductors to the lowermost active layers in the first and second substance have a maximum length matching the thickness of the thickest one of the first and second substacks.

7. The structure of claim 1, wherein:
    where N is greater than one, and the N steps include step (i), for i=0 to N−1, each step having a rise and a run, wherein the run of a last step (i=N−1) in the N steps is at the second level;
    the stack of active layers including N+1 substacks, including substacks (j), for j equal to 0 to N, and having respective uppermost layers, a first substack (j), j equal to 0, overlying the rises and runs of the N steps including the last step (i), i equal to N−1, intermediate substacks (j) for j equal to 1 to N−1 overlying the preceding substacks and overlying the rises of the steps (i), for i equal to N−1−j, and a uppermost substack overlying the preceding substacks and no step in the N steps, whereby the respective contact regions over the substacks in which uppermost layers of the substacks are disposed at the common level.

8. The structure of claim 7, wherein substacks have respective thicknesses, and the combination of the rise of the step (N−1−i), for j equal to 0 to N−1, with the thickness of substack (j), for j equal to i, matches the combination of the thicknesses of the substack (j) and substack (j+1).

9. The structure of claim 7, wherein the N+1 substacks have matching thicknesses, the rises of the steps match the thicknesses of the substacks.

10. The structure of claim 7, wherein the conductors to the lowermost active layers in the N+1 substacks have matching lengths from common level to the landing areas.

11. The structure of claim 7, wherein the conductors to the lowermost active layers in the N+1 substacks have a maximum length from the common level to the landing areas matching the thickness of the thickest one of the N+1 substacks.

12. The structure of claim 1, wherein the rise(s) of said N step(s) is/are on a side of a pit in the substrate.

13. An integrated circuit, comprising:
- a substrate having a memory area and a peripheral area, the memory area including a pit in the substrate having a stepped side;
- a stack of active layers in the memory area alternating with insulating layers on the substrate, active layers in the stack including landing pad areas;
- the stack including a plurality of substacks having respective uppermost layers, and with landing pad areas disposed in relation to the stepped side so that uppermost layers of the plurality of substacks are disposed at a common level in respective contact regions, each substack having an upper layer;
- a nonconductive, silicon nitride etch stop layer covering the upper layer of each of the plurality of sub stacks; and
- conductors in the respective contact regions extending to landing areas on the landing pads of the active layers in each of the plurality of substacks, the conductors passing through and physically contacting the nonconductive, silicon nitride etch stop layer.

14. The integrated circuit of claim 13, wherein the stack of active layers includes bit lines of a 3D NAND memory.

15. The integrated circuit of claim 13, wherein the stack of active layers includes word lines of a 3D NAND memory.

16. A method for manufacturing a structure for a multilayer device, comprising:
- forming N step(s), where N is an integer equal to one or greater, including step (i), for i=0 to N−1, from a surface of a substrate at a first level to a surface of the substrate at a second level, each step having a rise and a run, wherein the run of a last step (i=N−1) in the N steps is at the second level;
- forming a stack of active layers alternating with insulating layers on the substrate, the stack including N+1 substacks, including substacks (j), for j equal to 0 to N, and having respective uppermost layers, a first substack (j), j equal to 0, overlying the rises and runs of the N steps including the last step (i), i equal to N−1, intermediate substacks (j) for j equal to 1 to N−1 overlying the preceding substacks and overlying the rises of the steps (i), for i equal to N−1−j, and a uppermost substack overlying the preceding substacks and no step in the N steps; to form respective regions over the substacks in which uppermost layers of the substacks are disposed at a common level, each substack having an upper layer;
- forming a nonconductive, silicon nitride etch stop layer covering the upper layer of each sub stack; and
- forming vias in the respective regions passing through the etch stop layer and to landing areas on active layers in each of the plurality of substacks; and
- forming conductors in the vias, the conductors passing through and physically contacting the nonconductive, silicon nitride etch stop layer.

17. The method of claim 16, wherein substacks have respective thicknesses, and the combination of the rise of the step (N−1−i), for j equal to 0 to N−1, with the thickness of substack (j), for j equal to i, matches the combination of the thicknesses of the substack (j) and substack (j+1).

18. The method of claim 16, wherein the N+1 substacks have matching thicknesses, the rises of the steps match the thicknesses of the substacks.

19. The method of claim 16, wherein each substack has M layers, where M is between $(1+2^{K-1})$ and $2^K$, and the stack forming step includes at most K etching steps, whereby vias to landing areas on N+1 times M active layers are formed in the at most K etch steps.

20. The method of claim 16, wherein at least one substack has M layers, and M is between $(1+2^{K-1})$ and $2^K$, the other substacks have M layers or fewer, and the stack forming step includes at most K etching steps.

21. The method of claim 16, wherein said forming a step includes forming a pit in a substrate, a side of the pit including the rises of the N steps.

22. The structure of claim 1, wherein the active layers are polysilicon active layers.

23. The integrated circuit of claim 13, wherein the active layers are polysilicon active layers.

24. The method of claim 16, wherein the active layers forming step is carried out by forming a stack of polysilicon active layers.

* * * * *